(12) United States Patent
Fard et al.

(10) Patent No.: US 12,567,855 B2
(45) Date of Patent: Mar. 3, 2026

(54) SYSTEM AND METHOD FOR COUPLED RESONATOR FILTERING

(71) Applicant: QuantalRF AG, Zurich (CH)

(72) Inventors: Ali Fard, Corona Del Mar, CA (US); Mats Carlsson, Sundbyberg (SE); Jan Rapp, Hässelby (SE); David Westberg, Uppsala (SE); Omid Esmaeilzadeh Najari, San Diego, CA (US)

(73) Assignee: QUANTALRF AG (CH)

( * ) Notice: Subject to any disclaimer, the term of this patent is extended or adjusted under 35 U.S.C. 154(b) by 260 days.

(21) Appl. No.: 18/458,068

(22) Filed: Aug. 29, 2023

(65) Prior Publication Data

US 2024/0072766 A1 Feb. 29, 2024

Related U.S. Application Data

(60) Provisional application No. 63/402,882, filed on Aug. 31, 2022.

(51) Int. Cl.
H03H 9/60 (2006.01)
H03H 7/01 (2006.01)
(Continued)

(52) U.S. Cl.
CPC .......... H03H 9/605 (2013.01); H03H 7/0138 (2013.01); H03H 7/0161 (2013.01);
(Continued)

(58) Field of Classification Search
CPC ........ H03H 11/04; H03H 9/543; H03H 9/205; H03H 7/09; H03H 7/0161; H03H 9/605; H03H 7/0138
See application file for complete search history.

(56) References Cited

U.S. PATENT DOCUMENTS 4,858,094 A 8/1989 Barlage
5,434,538 A 7/1995 Lee et al.
(Continued)

FOREIGN PATENT DOCUMENTS

CN 1395438 A 2/2003
CN 101171745 A 4/2008
(Continued)

OTHER PUBLICATIONS

Extended European Search Report for EP12754969, dated Sep. 3, 2014, 6 pages.
(Continued)

*Primary Examiner* — Menatoallah Youssef
*Assistant Examiner* — Khareem E Almo
(74) *Attorney, Agent, or Firm* — Cooley LLP

(57) ABSTRACT

A coupled resonator filter including a first parallel resonator including a first capacitance connected in parallel with a first inductance. The filter includes a second parallel resonator including a second capacitance connected in parallel with a second inductance and a third parallel resonator including a third capacitance connected in parallel with a third inductance. Magnetic coupling between the first inductance and the second inductance, between the second inductance and the third inductance, and between the first inductance third inductance occurs in accordance with first, second and third coupling factors, respectively. A frequency response of the coupled resonator filter includes a notch when values of the first coupling factor, the second coupling factor and the third coupling factor satisfy predetermined conditions.

25 Claims, 37 Drawing Sheets

(51) Int. Cl.

| | |
|---|---|
| *H03H 7/09* | (2006.01) |
| *H03H 9/205* | (2006.01) |
| *H03H 9/54* | (2006.01) |
| *H03H 11/04* | (2006.01) |
| *H03K 17/687* | (2006.01) |

(52) U.S. Cl.
CPC .............. *H03H 7/09* (2013.01); *H03H 9/205* (2013.01); *H03H 9/542* (2013.01); *H03H 11/04* (2013.01); *H03H 2007/013* (2013.01); *H03K 17/6872* (2013.01)

(56) References Cited

U.S. PATENT DOCUMENTS

| | | | |
|---|---|---|---|
| 5,877,654 A | 3/1999 | Fong et al. | |
| 6,107,880 A | 8/2000 | Shaw | |
| 6,236,274 B1 | 5/2001 | Liu | |
| 6,744,314 B2 | 6/2004 | Zhang et al. | |
| 6,747,512 B2 | 6/2004 | Madni | |
| 7,339,436 B2 | 3/2008 | Fu et al. | |
| 7,486,137 B2 | 2/2009 | Magoon et al. | |
| 7,541,867 B2 | 6/2009 | Taylor | |
| 7,649,413 B2 | 1/2010 | Shiikuma | |
| 7,764,125 B2 | 7/2010 | Dawe | |
| 7,786,807 B1 | 8/2010 | Li et al. | |
| 8,102,213 B2 | 1/2012 | Tasic et al. | |
| 8,306,494 B2 | 11/2012 | Ojo | |
| 8,446,217 B2 | 5/2013 | Bagga | |
| 8,451,061 B2 | 5/2013 | Sagebiel et al. | |
| 8,912,845 B2 | 12/2014 | Jordan | |
| 9,813,025 B2 | 11/2017 | Wang | |
| 9,941,949 B2 | 4/2018 | Kessel | |
| 10,763,228 B2 | 9/2020 | Seebacher et al. | |
| 10,971,789 B2 * | 4/2021 | Gavryliuk | H01P 1/20327 |
| 11,205,998 B2 | 12/2021 | Kong et al. | |
| 11,206,006 B2 | 12/2021 | Bagga | |
| 11,979,114 B2 | 5/2024 | Fard et al. | |
| 12,034,411 B2 | 7/2024 | Fard et al. | |
| 12,052,004 B2 | 7/2024 | Carlsson | |
| 12,149,095 B2 * | 11/2024 | Yankowitz | H03F 1/565 |
| 12,149,210 B2 | 11/2024 | Fard et al. | |
| 12,160,203 B2 | 12/2024 | Fard et al. | |
| 12,278,599 B2 | 4/2025 | Fard et al. | |
| 2001/0019290 A1 | 9/2001 | Hecht | |
| 2003/0179038 A1 | 9/2003 | Madni | |
| 2005/0001680 A1 | 1/2005 | Ratzel | |
| 2005/0200431 A1 | 9/2005 | Lin et al. | |
| 2005/0208907 A1 | 9/2005 | Yamazaki et al. | |
| 2007/0241839 A1 | 10/2007 | Taniguchi | |
| 2007/0285162 A1 | 12/2007 | Vitzilaios et al. | |
| 2009/0245541 A1 | 10/2009 | Wang | |
| 2009/0251217 A1 | 10/2009 | Keerti | |
| 2010/0171568 A1 | 7/2010 | Taniguchi | |
| 2011/0074526 A1 * | 3/2011 | Taniguchi | H03H 7/1775 333/185 |
| 2011/0148527 A1 | 6/2011 | Bagga | |
| 2012/0313730 A1 * | 12/2012 | Ootsuka | H03H 7/1708 333/185 |
| 2013/0241672 A1 * | 9/2013 | Tamaru | H03H 7/0115 333/175 |
| 2013/0250536 A1 | 9/2013 | Satake | |
| 2014/0132343 A1 | 5/2014 | Colantonio et al. | |
| 2014/0184334 A1 | 7/2014 | Nobbe et al. | |
| 2014/0191800 A1 | 7/2014 | Jordan | |
| 2014/0204806 A1 | 7/2014 | Chuang et al. | |
| 2016/0079930 A1 | 3/2016 | Jin | |
| 2016/0254785 A1 | 9/2016 | Wang | |
| 2016/0336983 A1 | 11/2016 | Wang et al. | |
| 2017/0170798 A1 * | 6/2017 | Masuda | H03H 7/1708 |
| 2018/0062682 A1 | 3/2018 | Wloczysiak et al. | |
| 2018/0167038 A1 | 6/2018 | Lee et al. | |
| 2019/0140480 A1 | 5/2019 | Rouse | |
| 2020/0186177 A1 | 6/2020 | Gorbachov | |
| 2021/0250111 A1 | 8/2021 | Mori | |
| 2021/0409047 A1 | 12/2021 | Chen et al. | |
| 2022/0077835 A1 * | 3/2022 | Motoyama | H03H 7/0115 |
| 2022/0102070 A1 | 3/2022 | Fard et al. | |
| 2022/0103131 A1 | 3/2022 | Fard et al. | |
| 2022/0103132 A1 | 3/2022 | Fard et al. | |
| 2022/0103133 A1 | 3/2022 | Fard et al. | |
| 2022/0103134 A1 | 3/2022 | Fard et al. | |
| 2022/0190796 A1 | 6/2022 | Carlsson | |
| 2022/0337205 A1 | 10/2022 | Fard et al. | |
| 2022/0385238 A1 | 12/2022 | Fard et al. | |
| 2023/0208377 A1 * | 6/2023 | Saito | H03H 7/0115 333/132 |
| 2023/0238934 A1 * | 7/2023 | Mizoguchi | H01F 17/0013 333/167 |
| 2024/0080007 A1 | 3/2024 | Fard et al. | |
| 2024/0080017 A1 | 3/2024 | Fard et al. | |
| 2024/0213665 A1 * | 6/2024 | Tachibana | H01Q 1/50 |
| 2025/0141420 A1 * | 5/2025 | Nakazawa | H01F 27/00 |

FOREIGN PATENT DOCUMENTS

| | | |
|---|---|---|
| CN | 102017399 A | 4/2011 |
| CN | 104682910 A | 6/2015 |
| EP | 2685630 A1 | 1/2014 |
| JP | S5814609 A | 1/1983 |
| JP | S6355805 B2 | 11/1988 |
| JP | 2003273664 A | 9/2003 |
| JP | 2006521748 A | 9/2006 |
| JP | 2006269653 A | 10/2006 |
| JP | 2007215248 A | 8/2007 |
| JP | 2011517232 A | 5/2011 |
| JP | 2011199606 A | 10/2011 |
| JP | 2018098565 A | 6/2018 |
| KR | 20020068735 A | 8/2002 |
| KR | 20030074324 A | 9/2003 |
| KR | 100732070 B1 | 6/2007 |
| KR | 20080010569 A | 1/2008 |
| KR | 20110083991 A | 7/2011 |
| KR | 20210145745 A | 12/2021 |
| WO | WO-2010007177 A1 | 1/2010 |
| WO | WO-2019045073 A1 | 3/2019 |
| WO | WO-2020201298 A1 | 10/2020 |
| WO | WO-2022067201 A1 | 3/2022 |
| WO | WO-2022067202 A1 | 3/2022 |
| WO | WO-2022067203 A1 | 3/2022 |
| WO | WO-2022067205 A1 | 3/2022 |
| WO | WO-2022067208 A1 | 3/2022 |
| WO | WO-2022173862 A1 | 8/2022 |
| WO | WO-2023073197 A1 | 5/2023 |
| WO | WO-2023073199 A1 | 5/2023 |
| WO | WO-2023154823 A1 | 8/2023 |
| WO | WO-2024050442 A1 | 3/2024 |
| WO | WO-2024050443 A1 | 3/2024 |
| WO | WO-2024050444 A1 | 3/2024 |

OTHER PUBLICATIONS

Gefers, et al., A 1.2V, 200 W rail-to-rail Op Amp with 90dB THD using replica gain enhancement, Solid-State Circuits Conference, Sep. 24-26, 2002, pp. 175-178.

Hsiao, C., et al., CMOS Distributed Amplifiers Using Gate-Drain Transformer Feedback Technique, IEEE Transactions on Microwave Theory and Techniques, Aug. 2013, pp. 2901-2910.

International Preliminary Report on Patentability for International Application No. PCT/US021/052237, dated Aug. 9, 2023, 20 pages.

International Preliminary Report on Patentability for International Application No. PCT/US2021/052237, dated Aug. 9, 2023, 6 pages.

International Preliminary Report on Patentability for International Application No. PCT/US2021/052242 dated Apr. 6, 2023, 10 pages.

International Preliminary Report on Patentability for International Application No. PCT/US2021/052245 dated Apr. 4, 2023, 8 pages.

International Preliminary Report on Patentability for International Application No. PCT/US2022/015863 dated Apr. 13, 2023,7 pages.

International Preliminary Report on Patentability for PCT/US2021/052236, dated Dec. 9, 2022, 22 pages.

International Search Report and Written Opinion for Application No. PCT/US2021/052239 dated Jan. 4, 2022, 18 pages.

(56) References Cited

OTHER PUBLICATIONS

International Search Report and Written Opinion for International Application No. PCT/EP2020/059151, Oct. 7, 2020, 13 pages.
International Search Report and Written Opinion for International Application No. PCT/US2021/052236 dated Jan. 7, 2022, 18 pages.
International Search Report and Written Opinion for International Application No. PCT/US2021/052237 dated Jan. 7, 2022, 18 pages.
International Search Report and Written Opinion for International Application No. PCT/US2021/052242, Jan. 5, 2022, 18 pages.
International Search Report and Written Opinion for International Application No. PCT/US2022/015863 dated May 12, 2022, 18 pages.
International Search Report and Written Opinion issued in Application No. PCT/US2021/052245, dated Jan. 20, 2022, 18 pages.
Jeon, et al., A Transformer Feedback Wideband CMOS LNA for UWB Application, Asia-Pacific Microwave Conference (APMC), IEEE, Dec. 6, 2015, pp. 1-3.
Liscidini, et al., Common Gate Transformer Feedback LNA in a High IIP3 Current Mode RF CMOS Front-End, IEEE Custom Integrated Circuits Conference (CICC), Sep. 10, 2006, pp. 25-28,.
Ock, et al., A Cartesian Feedback Feedforward Transmitter, Circuits and Systems (ISCAS), 2011 IEEE International Symposium On, May 15, 2011, pp. 209-212.
Reiha, et al., A 1.2 V Reactive-Feedback 3.1-10.6 GHz Low-Noise Amplifier in 0.13 μm CMOS, IEEE Journal of Solid-State Circuits, May 2007, pp. 1023-1033.
Shailesh., et al., A State-of-the Art Review on Distributed Amplifiers, Wireless Personal Communications, Nov. 23, 2020, vol. 117(2), pp. 1471-1525. Retrieved from the Internet: URL: http://link.springer.com/article/10.1007/s11277-020-07932-9/fulltext.html.
Stochino, Audio Design Leaps Forward?, Electronics World, Oct. 1, 1994, pp. 818-820.

Wang, Y., et al., A 69.5-79 GHz Low Noise Amplifier in 65-nm CMOS Employing Transformer Feedback Technique, 14th IEEE International Conference on Solid-State and Integrated Circuit Technology (ICSICT), 2018, 3 pages.
Wu, L., et al., Design and Analysis of CMOS LNAs with Transformer Feedback for Wideband Input Matching and Noise Cancellation, IEEE Transactions on Circuits and Systems-I: Regular Papers, Jun. 2017, pp. 1626-1635.
Zhang, et al., Linearization Techniques for CMOS Low Noise Amplifiers: A Tutorial, IEEE Transactions on Circuits and Systems I: Regular Papers, Jan. 2011, pp. 22-36.
International Preliminary Report on Patentability for International Application No. PCT/EP2020/059151 mailed Oct. 14, 2021, 10 pages.
International Search Report and Written Opinion for PCT Application No. PCT/US2023/062323 mailed May 12, 2023, 16 pages.
Huang et al., Quasi-lumped Bandpass Filter with Sharp Transition Edge and Wide Stopband Rejection, Electronic Letters, Mar. 2013, pp. 479-480.
International Search Report and Written Opinion for International Application No. PCT/US2023/073197, mailed on Jan. 23, 2024, 16 pages.
International Search Report and Written Opinion for International Application No. PCT/US2023/073198 dated Jan. 8, 2024, 14 pages.
International Search Report and Written Opinion for PCT Application No. PCT/US2023/073199 dated Jan. 23, 2024, 10 pages.
International Preliminary Report on Patentability for International Application No. PCT/US2023/073197 mailed Mar. 13, 2025, 12 pages.
International Preliminary Report on Patentability for International Application No. PCT/US2023/073198, dated Mar. 1, 2025, 8 pages.
International Preliminary Report on Patentability for International Application No. PCT/US2023/073199, dated Mar. 1, 2025, 11 pages.

* cited by examiner

2000

2010

*Typical frequency response of a third order resonator filter*

*Typical frequency response of a third order resonator filter with QA-notches, simulations and measurements (pink graph) compared*

*Frequency response of a filter and LNA implementation with and without an additional input notch*

3204

3240

3240

Magnetic coupled resonator filter and source-degenerated LNA

3202

3220

3210

Electrically coupled resonator filter and source-degenerated LNA

SYSTEM AND METHOD FOR COUPLED RESONATOR FILTERING

CROSS REFERENCE TO RELATED APPLICATIONS

This application claims the benefit of priority under 35 U.S.C. § 119(e) of Provisional Application No. 63/402,882 entitled SYSTEM AND METHOD FOR INTEGRATED FILTERING AND AMPLIFICATION, filed Aug. 31, 2022. This application is related to application Ser. No. 17/735,358, entitled INTEGRATED COUPLED RESONATOR FILTERING, filed on even date herewith.

FIELD

The present disclosure generally relates to filter circuits and, more particularly, to coupled resonator filters.

BACKGROUND

Coupled resonator filters are extensively described in literature and in scientific papers. See, e.g., "*The Design of Direct Coupled Band Pass Filters*", published by Iowa Hills Software (Jul. 10, 2016), which has been used for the calculations of an electrically coupled resonator filter. Most of the published documents and literature relating to coupled resonator filters are concerned with cavity-based resonator filters. See, e.g., the reference text *Microwave Filters for Communication Systems* by Richard J. Cameron et al. There are also Internet-based calculators that can be used to calculate component parameters of capacitively coupled resonator filters. See, e.g., the site https://rf-tools.com/lc-filter/. This particular online calculator is limited to calculating component parameters based upon capacitive coupling and equal load and source impedances. FIG. 1 is a screen shot of an exemplary user interface 100 generated by the coupled resonator filter calculator found at https://rf-tools.com/lc-filter/.

FIG. 2 provides an example of a source-gate feedback LNA topology 200 of a type described in the existing literature. See for instance the paper "*Analysis and Design of a Transformer-Feedback-Based Wideband Receiver*", *IEEE TRANSACTIONS ON MICROWAVE THEORY AND TECHNIQUES*, VOL. 61, NO. 3, MARCH 2013, Bhagavatula and Rudell. The output matching of the low-noise amplifier (LNA) 210 in FIG. 2 to the load is realized with an LC matching network 220 including an inductance 224 ($L_O$), a capacitance 226 ($C_{match}$) and a resistance 228 ($R_O$) (which may include an inherent resistance associated with La and an added physical resistance), wherein the inductance 224 ($L_O$) and the capacitance 226 ($C_{match}$) are used for impedance transformation. The input impedance of the LNA in FIG. 2 is defined by the properties of the active device 230 (M1) in combination with the feedback network consisting of a first inductance 240 ($L_1$) which is coupled to a second inductance 242 ($L_2$).

SUMMARY

Disclosed herein are innovative techniques for on-chip integrated RF filtering and amplification. These innovative techniques may be utilized in high performance RF integrated circuits and front-end modules (FEM) incorporated in, for example, cell phones, routers and personal computers.

In one aspect the disclosure pertains to a coupled resonator filter including first, second and third parallel resonators. The first parallel resonator includes a first capacitance connected in parallel with a first inductance. The second parallel resonator includes a second capacitance connected in parallel with a second inductance. The third parallel resonator includes a third capacitance connected in parallel with a third inductance. Magnetic coupling between the first inductance and the second inductance magnetically couples the first parallel resonator and the second parallel resonator in accordance with a first coupling factor; magnetic coupling between the second inductance and the third inductance magnetically couples the second parallel resonator and the third parallel resonator in accordance with a second coupling factor; and magnetic coupling between the first inductance and the third inductance magnetically couples the first parallel resonator and the third parallel resonator in accordance with a third coupling factor. A frequency response of the coupled resonator filter includes a notch when values of the first coupling factor, the second coupling factor and the third coupling factor satisfy predetermined conditions.

The disclosure also relates to an integrated circuit coupled resonator filter including first, second and third parallel resonators. The first parallel resonator includes a first capacitance connected in parallel with a first inductance. The second parallel resonator includes a second capacitance connected in parallel with a second inductance. The third parallel resonator includes a third capacitance connected in parallel with a third inductance. Magnetic coupling between the first inductance and the second inductance magnetically couples the first parallel resonator and the second parallel resonator in accordance with a first coupling factor; magnetic coupling between the second inductance and the third inductance magnetically couples the second parallel resonator and the third parallel resonator in accordance with a second coupling factor; and magnetic coupling between the first inductance and the third inductance magnetically couples the first parallel resonator and the third parallel resonator in accordance with a third coupling factor. A frequency response of the coupled resonator filter includes a notch when values of the first coupling factor, the second coupling factor and the third coupling factor satisfy predetermined conditions.

The inductances of the coupled resonator filters may be implemented in various configurations and in various layers of the integrated circuit. For example, the first inductance, the second inductance and the third inductance may be implemented on multiple layers of the integrated circuit and at least partially overlap. Alternatively, at least the first inductance and the second inductance may be implemented on a same layer of the integrated circuit and not overlap. The third inductance may also be implemented on the same layer of the integrated circuit and not overlap with the first inductance and the second inductance.

In another configuration two of the first inductance, the second inductance, and third inductance are implemented on a first layer of the integrated circuit and a remaining one of the first inductance, the second inductance, and third inductance is implemented on a second layer of the integrated circuit. In one implementation of this configuration at least one of the two of the first inductance, the second inductance, and third inductance implemented on the first layer of the integrated circuit overlaps the remaining one of the first inductance, the second inductance, and third inductance implemented on the second layer of the integrated circuit.

Each of the first inductance, the second inductance, and third inductance may be implemented on different layers of the integrated circuit. In this case the first inductance, the second inductance, and third inductance may be arranged to at least partially overlap. Alternatively, two of the first inductance, the second inductance, and third inductance are arranged to at least partially overlap.

In another aspect the disclosure relates to an integrated circuit coupled resonator filter including a low-noise amplifier and first, second and third parallel resonators. The first parallel resonator includes a first capacitance connected in parallel with a first inductance. The second parallel resonator includes a second capacitance connected in parallel with a second inductance. The third parallel resonator includes a third capacitance connected in parallel with a third inductance, the third parallel resonator being coupled to an input of the low-noise amplifier. A first coupling capacitance is connected between the first parallel resonator and the second parallel resonator. The coupling capacitance capacitively couples the first parallel resonator and the second parallel resonator. A second coupling capacitance is connected between the second parallel resonator and the third parallel resonator. The second coupling capacitance capacitively couples the second parallel resonator and the third parallel resonator. Magnetic coupling between the first inductance and the second inductance magnetically couples the first parallel resonator and the second parallel resonator in accordance with a first coupling factor; magnetic coupling between the second inductance and the third inductance magnetically couples the second parallel resonator and the third parallel resonator in accordance with a second coupling factor; and magnetic coupling between the first inductance and the third inductance magnetically couples the first parallel resonator and the third parallel resonator in accordance with a third coupling factor. A frequency response of the coupled resonator filter includes a notch when values of the first coupling factor, the second coupling factor and the third coupling factor satisfy predetermined conditions.

The disclosure also pertains to an integrated circuit coupled resonator filter including a low-noise amplifier and first, second and third parallels resonators. The first parallel resonator includes a first capacitance connected in parallel with a first inductance. The second parallel resonator includes a second capacitance connected in parallel with a second inductance. The third parallel resonator includes a third capacitance in parallel with a third inductance and is coupled to an input of the low-noise amplifier. Magnetic coupling between the first inductance and the second inductance magnetically couples the first parallel resonator and the second parallel resonator in accordance with a first coupling factor; magnetic coupling between the second inductance and the third inductance magnetically couples the second parallel resonator and the third parallel resonator in accordance with a second coupling factor; and magnetic coupling between the first inductance and the third inductance magnetically couples the first parallel resonator and the third parallel resonator in accordance with a third coupling factor. A frequency response of the coupled resonator filter includes a notch when values of the first coupling factor, the second coupling factor and the third coupling factor satisfy predetermined conditions.

In yet another aspect the disclosure relates to an integrated circuit coupled resonator filter which includes a low-noise amplifier, an Nth order coupled resonator filter, and an Mth order coupled resonator filter. The Nth order coupled resonator filter is coupled to an input of the low-noise amplifier and includes N magnetically coupled parallel resonators arranged in succession, where N is at least 3 and where the N magnetically-coupled parallel resonators are configured to induce substantially only magnetic coupling therebetween. The Mth order coupled resonator filter is coupled to an output of the low-noise amplifier and includes M magnetically coupled parallel resonators arranged in succession, where M is at least 3 and where the M magnetically-coupled parallel resonators are configured to induce substantially only magnetic coupling therebetween.

A first parallel resonator of the N parallel resonators may be connected to a signal source and configured with an input impedance equal to an impedance of the signal source. An $M^{th}$ parallel resonator of the M parallel resonators may be connected to a signal load and configured with an output impedance equal to an impedance of the signal load.

A frequency response of the $N^{th}$ order coupled resonator filter may include a first notch at a first frequency which is dependent upon coupling characteristics between parallel resonators of the N parallel resonators. A frequency response of the $M^{th}$ order coupled resonator filter may include a second notch at a second frequency dependent upon coupling characteristics between parallel resonators of the M parallel resonators.

The disclosure is further directed to a programmable coupled resonator filter arrangement including an Nth order coupled resonator filter. The Nth order coupled resonator filter includes N magnetically coupled parallel resonators arranged in succession, where N is at least 3. Each of the N magnetically coupled parallel resonators includes an inductance in parallel with a programmable capacitance arrangement. A frequency response of the coupled resonator filter arrangement includes a first notch at a first frequency dependent upon coupling characteristics between parallel resonators of the N parallel resonators.

Each programmable capacitance arrangement may include a capacitance connected to a switch where each switch includes a terminal connected to signal ground.

The programmable coupled resonator filter arrangement may further include a series resonant circuit connected in parallel with any of the N magnetically coupled parallel resonators. The frequency response of the coupled resonator filter arrangement may include a second notch at a second frequency dependent upon a resonance frequency of the series resonant circuit.

BRIEF DESCRIPTION OF THE DRAWINGS

The features, nature and advantages of the present disclosure will become more apparent from the detailed description set forth below when taken in conjunction with the drawings in which like reference characters identify correspondingly throughout and wherein.

DETAILED DESCRIPTION

Disclosed herein are innovative techniques for on-chip integrated RF filtering, noise and distortion suppression, and amplification. These innovative techniques may be utilized in high performance RF integrated circuits and front-end modules incorporated within, for example, mobile phones, routers and personal computers.

The innovative techniques described in the present disclosure may be broadly divided into the following two groups: (i) integrated magnetically and electrically coupled on-chip resonator filters, and (ii) on-chip coupled resonator filters combined with a low-noise amplifier ("LNA"). The innovations within groups (i) and (ii) can work stand-alone but are also advantageously combined. A detailed description of the innovations within each group is provided in the following sections.

Exemplary Receiver Architecture with Filtering and Amplification

Figure 3:
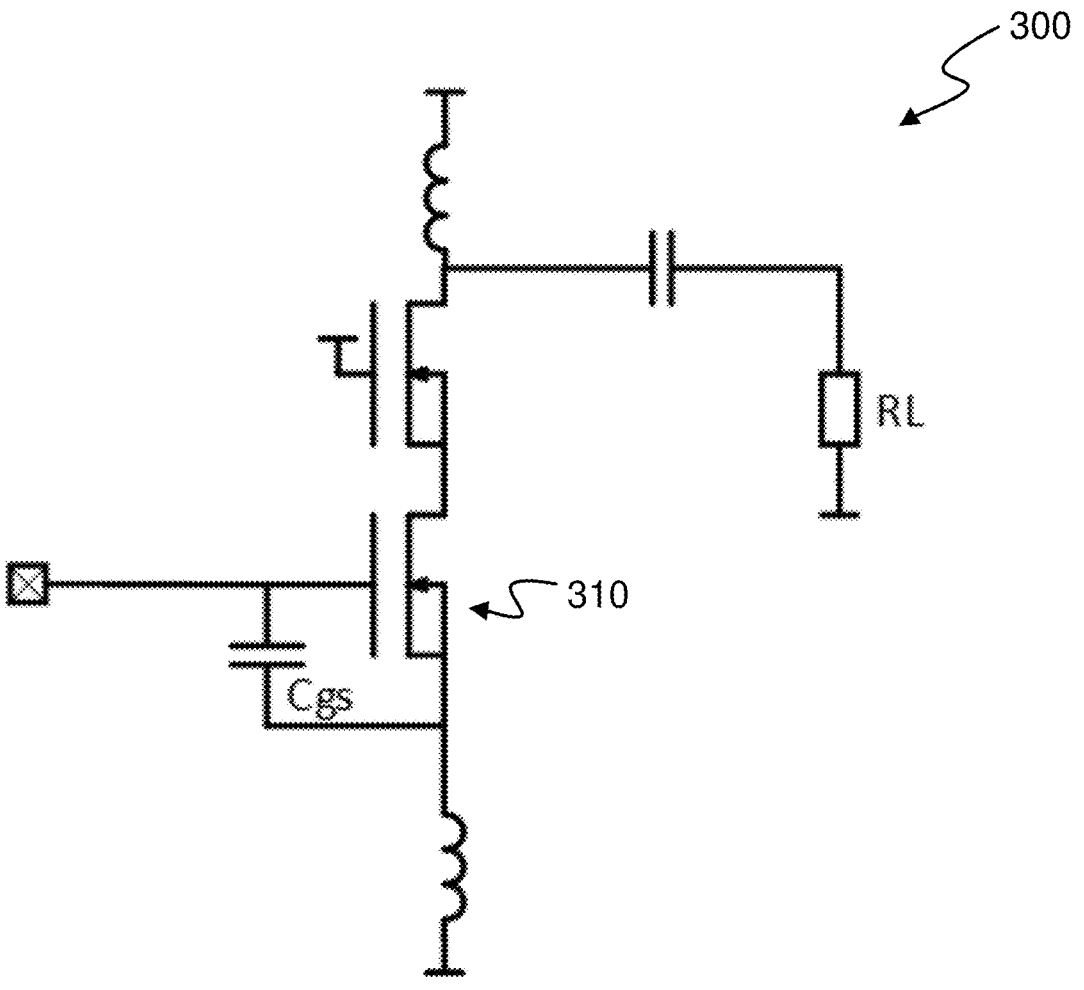
FIG. 3 illustrates an exemplary topology of a source-degenerated LNA.
Figures 4A, 4B:
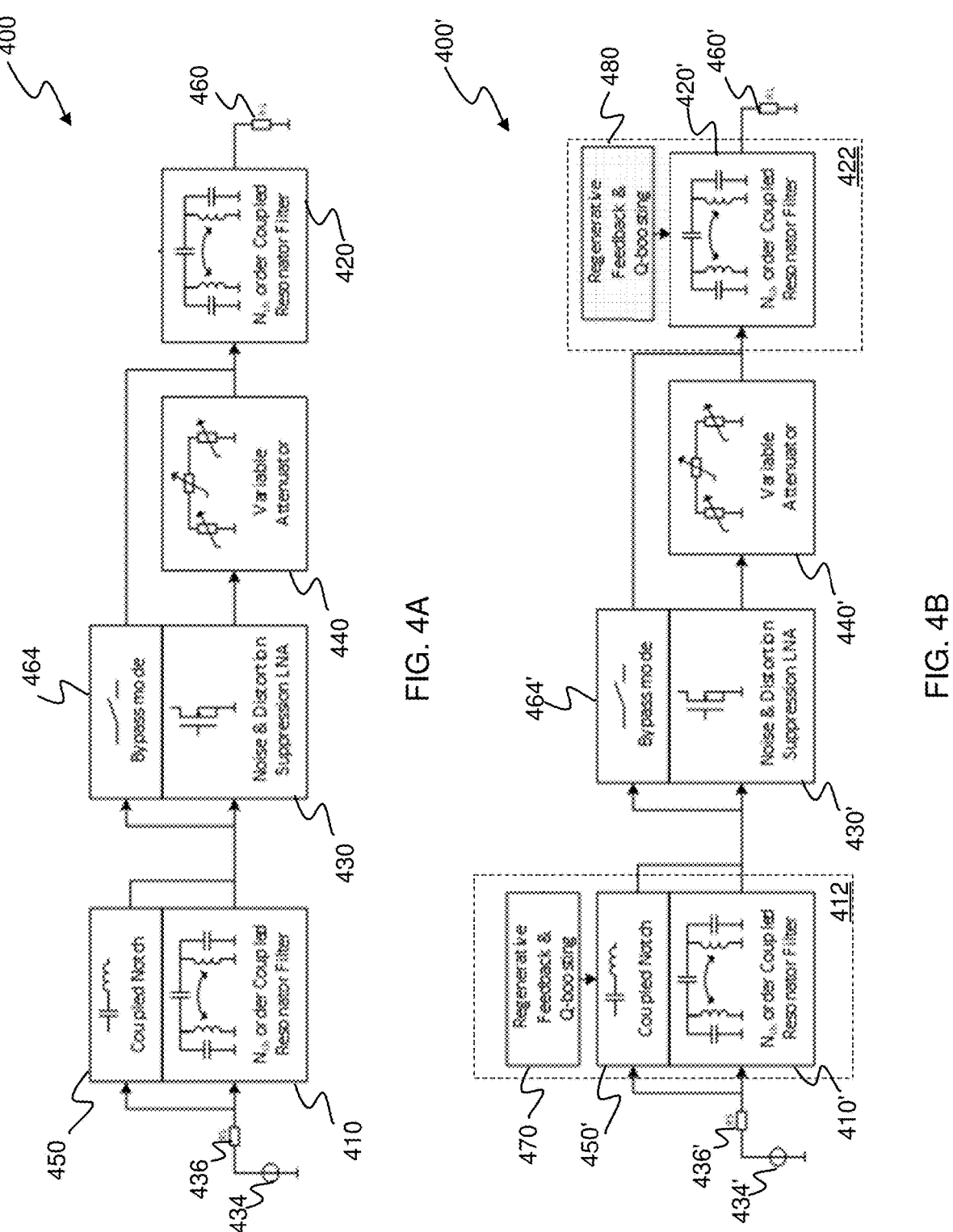
FIG. 4A is a system block diagram of a receiver with filtering and amplification in accordance with the disclosure.
FIG. 4B is a system block diagram of a receiver operative to perform Q-boosted filtering and amplification in accordance with the disclosure.

FIG. 4A is a system block diagram of a receiver 400 with filtering and amplification in accordance with the disclosure. As illustrated in FIG. 4A, the receiver 400 includes first and second Nth order coupled resonator filters 410, 420, a low-noise amplifier 430 connected to an output of the coupled resonator filter 410, and a variable attenuator 440 interposed between the LNA 430 and the coupled resonator filter 420. The first Nth order coupled resonator filter 410 receives an input signal from a signal source 434 having a source resistance 436 ($R_S$). A coupled notch circuit 450 may be added to the coupled resonator filter in order to improve out-of-band attenuation as described hereinafter. Placing the second Nth order coupled resonator filter 420 at the output of the receiver 400, where it is coupled to the load 460 ($R_L$), can render the output matching more wideband relative a conventional single resonator resonant load and matching network of the type shown in FIG. 3. Although the exemplary receiver 400 of FIG. 4A includes first and second Nth order coupled resonator filters implemented as described hereinafter, other embodiments of receivers in accordance with the disclosure may include additional coupled resonator filters, attenuators and the like. In other receiver embodiments within the scope of the present disclosure the number of coupled resonator filters and their degree (e.g., N=3, 4, etc.), and whether such filters are augmented with coupled notch circuits, will depend upon the filtering requirements or specifications associated with a particular application.

As shown in FIG. 4A, in one embodiment the receiver 400 includes a bypass mode switch module 464. When the switch module 464 is in a closed configuration, the low-noise amplifier 430 and variable attenuator 440 are bypassed; otherwise, signal energy from the resonator filter 410 is amplified by the LNA 430 and variably attenuated by the variable attenuator 440 before being provided to the second Nth order coupled resonator filter 420.

Turning now to FIG. 4B, a system block diagram is provided of a receiver 400' operative to perform Q-boosted filtering and amplification in accordance with the disclosure. As may be appreciated, the architecture of the receiver 400' is substantially similar to that of the receiver 400. However, in lieu of the first and second Nth order coupled resonator filters 410, 420, the receiver 400' includes first and second Q-boosted coupled resonator filter modules 412, 422. As shown, the first Q-boosted coupled resonator filter module 412 includes an Nth order coupled resonator filter 410' and a coupled notch circuit 450', which may be substantially similar or identical to the Nth order coupled resonator filter 410 and coupled notch circuit 450 of FIG. 4A. In the first Q-boosted coupled resonator filter module 412, the Nth order coupled resonator filter 410' and coupled notch circuit 450' are connected to a regenerative feedback & Q-boosting circuit 470. In one embodiment the regenerative feedback & Q-boosting circuit 470 includes an active device (e.g., a MOSFET) configured with a positive feedback loop. This arrangement results in the active device producing a negative transconductance, which offsets parasitic losses inherent in inductive elements coupled resonator filter 410' and coupled notch circuit 450' and thereby improves the quality factor (Q) of each. By boosting the Q of the coupled resonator filter 410' and coupled notch circuit 450' it is possible to obtain very sharp attenuation at edges of the filter band conjunctively produced by the filters 410', 450'.

The second Q-boosted coupled resonator filter module 422 includes an Nth order coupled resonator filter 420', which may be substantially similar or identical to the Nth order coupled resonator filter 420 of FIG. 4A. In addition, the second Q-boosted coupled resonator filter module 422 includes a regenerative feedback & Q-boosting circuit 480 connected to the Nth order coupled resonator filter 420'. The regenerative feedback & Q-boosting circuit 480 may be configured similarly to the Q-boosting circuit 470 in order to boost the Q of the coupled resonator filter 420'.

Figure 4C:
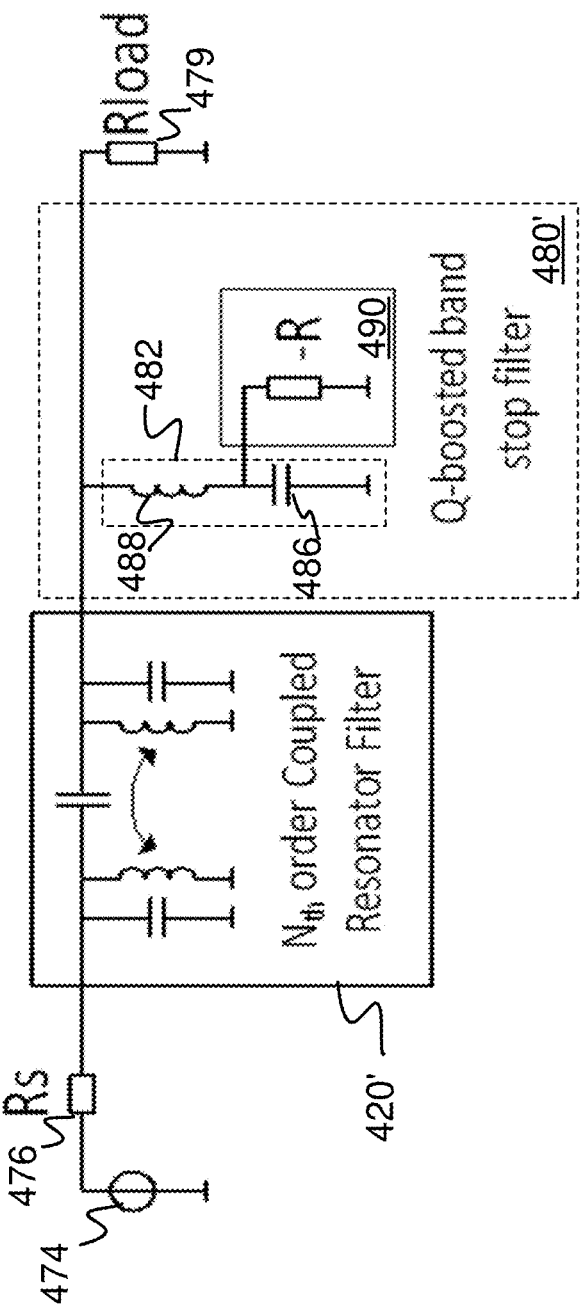
FIG. 4C is a block diagram of an exemplary implementation of a Q-boosted band stop filter.

Attention is now directed to FIG. 4C, which is a block diagram of an exemplary implementation of the regenerative feedback & Q-boosting circuit 480 as a Q-boosted band stop filter 480'. As shown, the Q-boosted band stop filter 480' is connected in parallel with the Nth order coupled resonator filter 420' and is coupled to load 479 ($R_L$). The Nth order coupled resonator filter 420' receives an input signal from a signal source 474 having a source resistance 476 ($R_S$). In the implementation of FIG. 4C, the Q-boosted band stop filter 480' includes a series resonant circuit 482 having a capacitance 486 and an inductance 488. A specially configured regenerative electronic circuit 490 in parallel with the capacitance 486 adds a negative resistance across the capacitance 486. By careful selection of the parameters of the circuit 490, the losses in at least the inductance 488 are cancelled by the added negative resistance and the Q-factor of the series resonant circuit 482 is thereby increased.

The Q-boosting circuit 480 implemented as the Q-boosted band stop filter 480' offers a number of advantages relative to conventional methods for improving receiver performance. For example, improving the sharpness of filter frequency response characteristics in receivers has typically involved utilizing higher order filters or adding bulky and expensive acoustic wave filtering elements. Moreover, simply utilizing conventional band stop filters to improve the sharpness of filter characteristics at filter band edges is generally not a viable approach since even to the extent such filters may improve filter roll off characteristics their relatively low quality factors can result in degradation of the shape of the filter passband and induce interference in neighboring bands.

The high quality factor of the Q-boosted band stop filter 480' relative to conventional band stop filters enables it improve filter roll off/sharpness characteristics without otherwise degrading filter passband characteristics or causing interference in adjacent frequency bands. In order to facilitate the implementation of the Q-boosted band stop filter 480' in integrated circuits, embodiments of the filter 480' have been designed to overcome various challenges that have prevented the introduction of positive feedback amplifiers in integrated filter technologies for Q boosting purposes. For example, the circuit 490 is dimensioned to ensure that the overall resistive part of the resonator 420' remains positive so as to preclude oscillatory behaviour. The negative resistance effected by the circuit 490 reduces the losses of the inductance in each resonator 410', 420', which can at resonance be approximated with its parallel equivalent. At frequencies far away from the resonance frequency, the reactive elements of the resonator 410', 420' become dominant and the negative resistance can be neglected. As a consequence, signals in in out-of-band frequencies are generally unaffected.

Figures 5A, 5B:
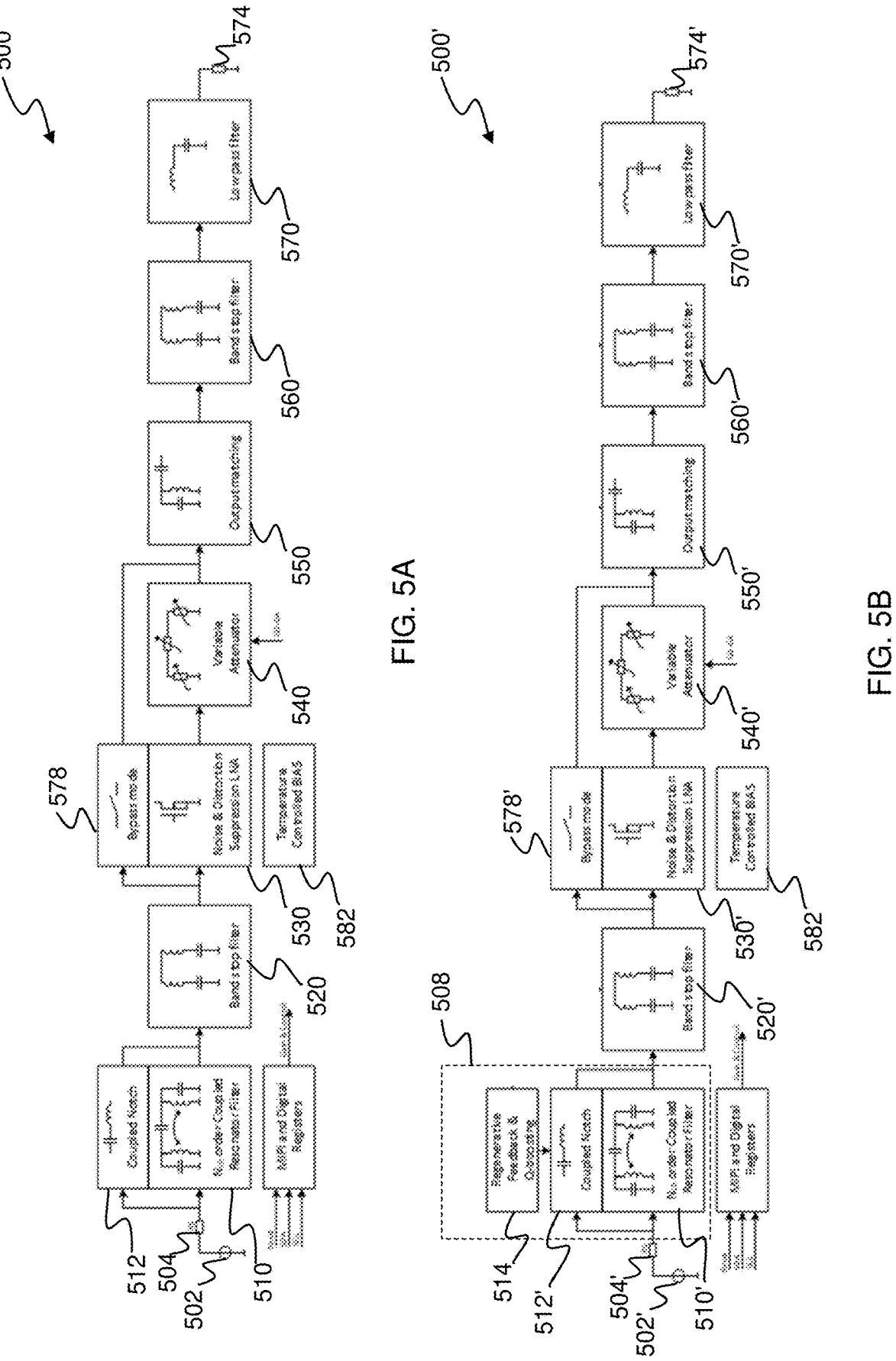
FIG. 5A is an extended system block diagram of a receiver with filtering and amplification in accordance with the disclosure.
FIG. 5B is an extended system block diagram of a receiver operative to perform Q-boosted filtering and amplification in accordance with the disclosure.

Referring now to FIG. 5A, there is shown an extended system block diagram of a receiver 500 with filtering and amplification in accordance with the disclosure. As is illustrated in FIG. 5A, the receiver 500 includes an Nth order magnetically coupled resonator filter 510 serially coupled to a band stop filter 520, a low-noise amplifier 530 connected to an output of the band stop filter 520, and a variable attenuator 540 interposed between the LNA 530 and an output matching network 550. The Nth order coupled resonator filter 510 and a coupled notch circuit 512 receive an input signal from a signal source 502 having a source resistance 504 ($R_S$). The receiver 500 may further include an additional band stop filter 560 and an output low pass filter 570 coupled to load 574 ($R_L$). The coupled notch circuit 512 may be added to the coupled resonator filter 510 in order to improve out-of-band attenuation in similar manner as the coupled notch filter 450 (FIG. 4). Although the exemplary receiver 500 of FIG. 5A includes only a single Nth order coupled resonator filter, other embodiments of receivers in accordance with the disclosure may include additional coupled resonator filters, attenuators and the like.

As shown in FIG. 5A, in one embodiment the receiver 500 includes a bypass mode switch module 578. When the switch module 589 is in a closed configuration, the low-noise amplifier 530 and variable attenuator 540 are bypassed; otherwise, signal energy from the band stop filter 520 is amplified by the LNA 530 and variably attenuated by the variable attenuator 540 before being provided to the output matching network 550. The receiver 500 may include a temperature-controlled bias module 582 for biasing active components of the low-noise amplifier 530 as a function of temperature so as to, for example, make the gain of the low-noise amplifier substantially independent of temperature.

Turning now to FIG. 5B, an extended system block diagram is provided of a receiver 500' operative to perform Q-boosted filtering and amplification in accordance with the disclosure. As may be appreciated, the architecture of the receiver 500' is substantially similar to that of the receiver 500. However, in lieu of the Nth order coupled resonator filter 510, the receiver 500' includes a Q-boosted coupled resonator filter module 508. As shown, the Q-boosted coupled resonator filter module 508 includes an Nth order coupled resonator filter 510' and a coupled notch circuit 512', which may be substantially similar or identical to the Nth order coupled resonator filter 510 and coupled notch circuit 512 of FIG. 5A. As shown, in the Q-boosted coupled resonator filter module 508 the Nth order coupled resonator filter 510' and coupled notch circuit 512' are connected to a regenerative feedback & Q-boosting circuit 514. In one embodiment the regenerative feedback & Q-boosting circuit 514 is implemented in essentially the same manner as the Q-boosted band stop filter 480' of FIG. 4C. That is, the circuit 514 is implemented to include an active device (e.g., a MOSFET) configured with a positive feedback loop. This arrangement results in the active device producing a negative transconductance, which offsets parasitic losses inherent in inductive elements in the coupled resonator filter 510' and the coupled notch circuit 512' and thereby improves the quality factor (Q) of each. By boosting the Q of the coupled resonator filter 510' and coupled notch circuit 512' it is possible to obtain very sharp attenuation at edges of the filter band conjunctively produced by the filters 510', 512'.

Integrated Magnetically and Electrically Coupled Resonator Filters

Figure 6:
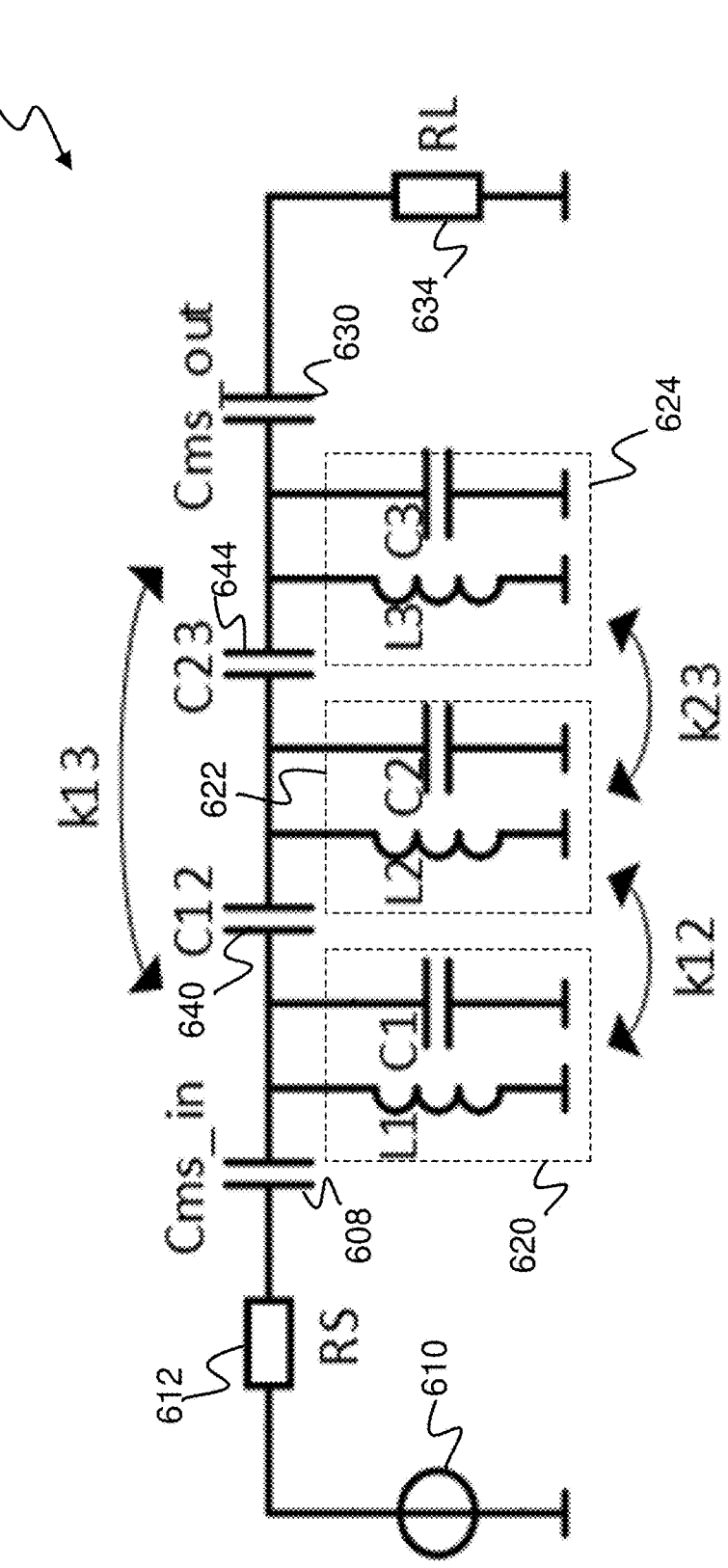
FIG. 6 schematically illustrates a third order coupled resonator filter with both magnetic and electrical coupling in accordance with the disclosure.

Attention is now directed to FIG. 6, which schematically illustrates a third order coupled resonator filter 600 with both magnetic and electrical coupling in accordance with the disclosure. As shown, an input matching capacitance 608 (Cms_in) is connected in series with a signal source 610 having a source resistance 612 ($R_S$). The three resonators of the third order coupled resonator filter 600 consist of the parallel combination of a first resonator 620 (L1 and C1), a second resonator 622 (L2 and C2), and a third resonator 624 (L3 and C3) respectively. The filter 600 includes an output matching capacitance 630 (Cms_out) connected in series with a load represented by load resistance 634 ($R_L$).

The electrical coupling between the first and second resonators of the resonator filter 600 is achieved by a first capacitance 640 (C12), and a second capacitance 644 (C23) provides the electrical coupling between the second and third resonator. The amount of magnetic coupling between the first and second resonator is characterized by the coupling factor k12, and k23 gives the amount of magnetic coupling between the second and third resonator. The direct magnetic coupling between the first and third resonator is characterized by k13. The coupling factor between two on-chip inductors is characterized by Electro-Magnetic simulations and is defined by the equation:

$$k12 = \frac{M}{\sqrt{L1L2}}$$

where M is the mutual inductance between L1 and L2. The coupling factor k23 may be similarly represented as a function of L2 and L3.

Although the filter 600 could theoretically be implemented using an arbitrarily large number of resonators, it is anticipated that using either two or three resonators will be the most practical approach for purposes of on-chip integration. The mathematical expressions enabling calculation of the parameters of filter 600 have been derived and entered into an electronic spreadsheet (e.g., an Excel sheet) to facilitate computation. These expressions are described in a separate section below.

Figure 10:
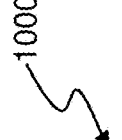
FIG. 10 is a screen shot of an interface for an electronic spreadsheet used for determination of filter component parameters.

FIG. 10 illustrates a screen shot of an interface 1000 for an electronic spreadsheet used for determination of filter component parameters in accordance with the disclosure. In one implementation the following procedure is employed to derive the component values of the filter 600, and of other coupled resonator filters described herein, using the spreadsheet.

(1) Choose source and load impedances
(2) Choose filter bandwidth and center frequency
(3) Choose desired inductance values
(4) Choose the passband ripple of the filter
(5) Choose the amount of magnetic coupling that is desired (from −100 to +100%).

When the values associated with steps (1) through (5) of the procedure have been entered into the electronic spreadsheet (e.g., into the cells of the interface 1000 with blue text as shown in FIG. 10), all the component values are calculated based on mathematical expressions which have been derived and are described herein.

It may be appreciated that implementing a filter with only electric coupling puts constraints on the implementation of a filter realized as an integrated circuit, as the inductors must be separated far away from each other to avoid magnetic coupling between the inductors in the resonators and thereby deviation from the intended filter performance. This separation disadvantageously requires a layout consuming a large chip-area. In contrast, the present inventors have found that combining electrical and magnetic coupling yields multiple benefits such as, for example, reduced chip area. When only magnetic coupling is used, the required chip area becomes even smaller and the routing to capacitances connecting the different resonators can be removed. This results in the layout becoming significantly easier to implement.

Figure 7:
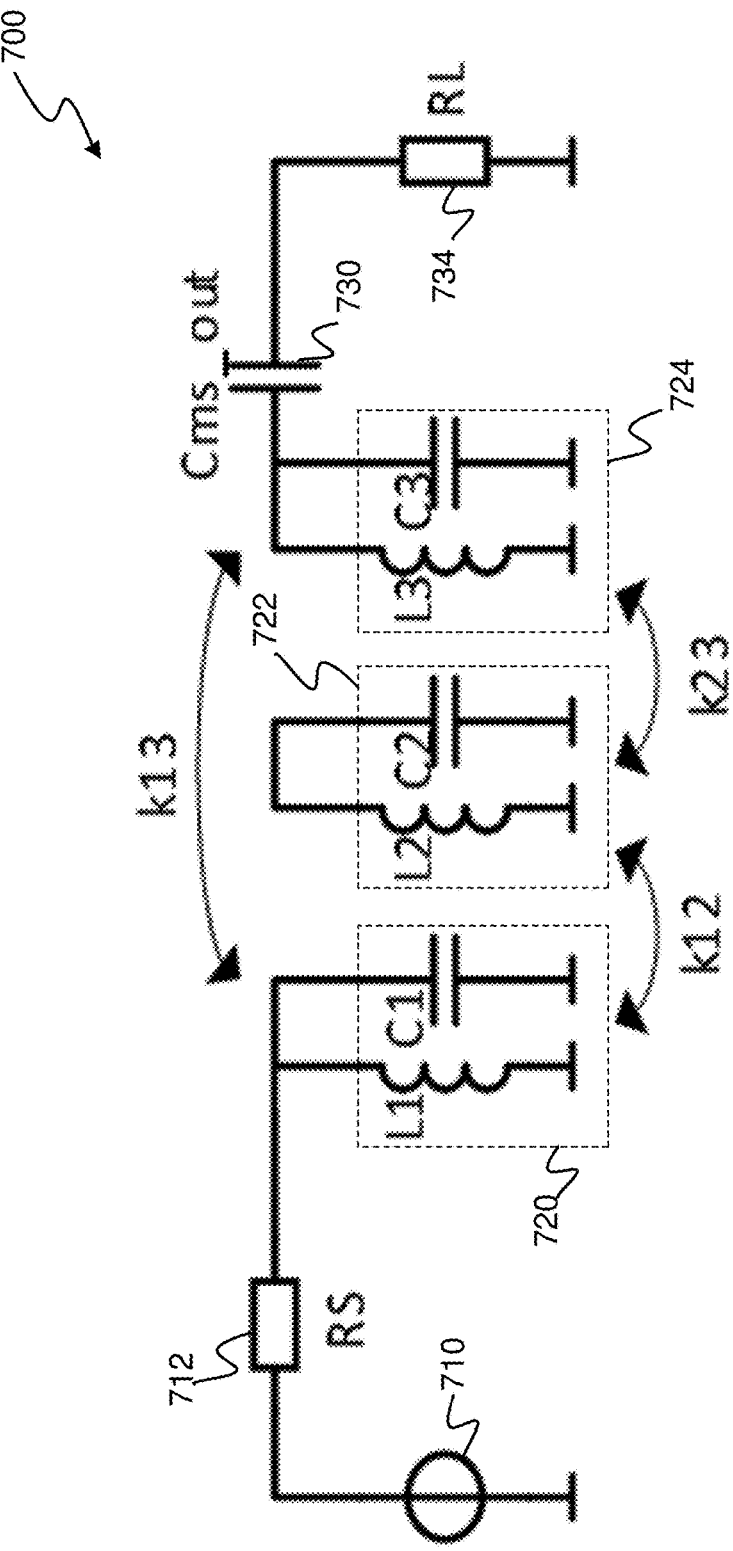
FIG. 7 schematically illustrates a third order coupled resonator filter with only magnetic coupling in accordance with the disclosure.

Turning now to FIG. 7, a schematic illustration is provided of a third order coupled resonator filter 700 having only magnetic coupling. As in the case of the third order coupled resonator filter 600 of FIG. 6, the third order coupled resonator filter 700 includes three resonators consisting of the parallel combination of a first resonator 720 (L1 and C1), a second resonator 722 (L2 and C2), and a third resonator 724 (L3 and C3) respectively. The filter 700 includes an output matching capacitance 730 (Cms_out) connected in series with a load represented by load resistance 734 (RL).

As shown, the filter 700 lacks an input matching capacitance (the input matching capacitance 608 present in the filter 600 is not included in the filter 700) in series with a source impedance 712 (RS) of a signal source 710. This forces the impedance level of the first resonator 720 (L1, C1) to be equal to the source impedance 712 (RS) if a suitable input match is to be realized. The removal of the first matching capacitance Cms_in in the filter 700 is advantageous from an electrostatic discharge (ESD) point of view since the shunt inductor L1 will protect the input from ESD pulses and thereby remove the need for dedicated ESD protection diodes. Such diodes may cause distortion when large signals are applied at the input of the filter 700.

Figure 14:
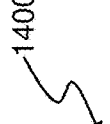
FIG. 14 illustrates an exemplary layout of a third order resonator filter with only magnetic coupling.
Figure 14:
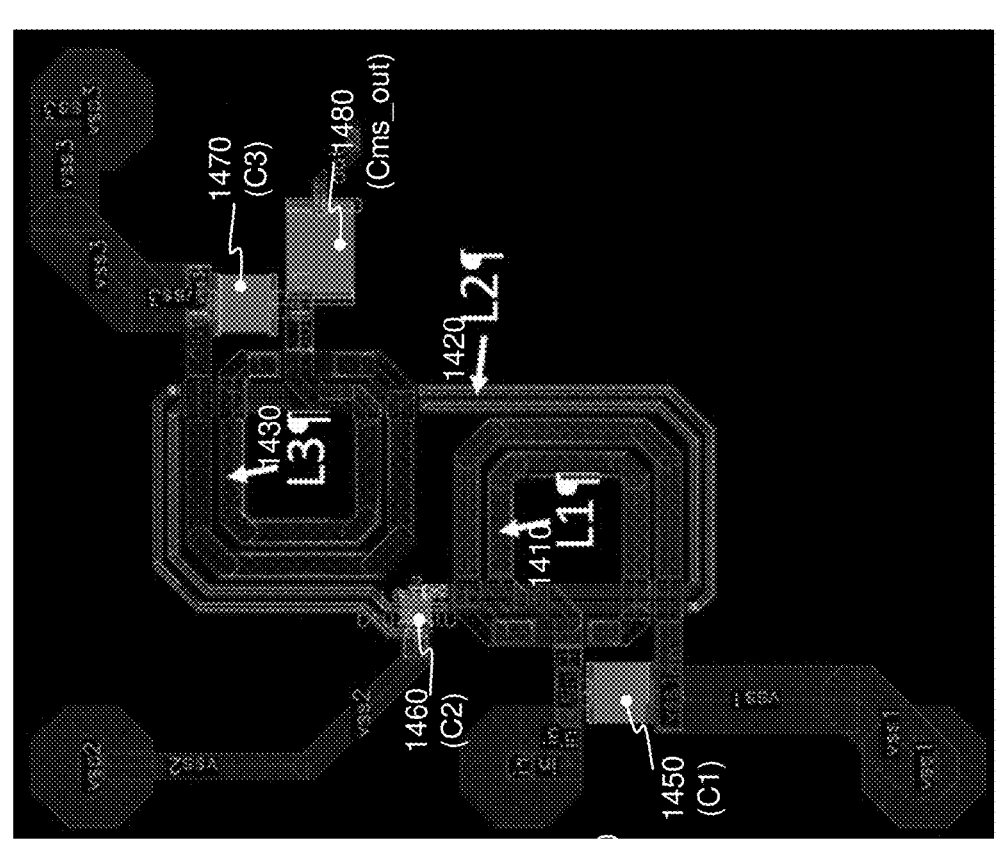

FIG. 14 illustrates an exemplary layout of a third order resonator filter 1400 with only magnetic coupling. When only magnetic coupling is used as in the filter 1400, the inductors L1, L2 and L3 can be laid out to overlap each other, which is beneficial from the point of view of conserving chip area. As also can be appreciated when only magnetic coupling is used, the routing to the coupling capacitors (C12 and C23 in FIG. 6) is not required as the coupling capacitors are equal to zero, which simplifies the layout.

Figure 8:
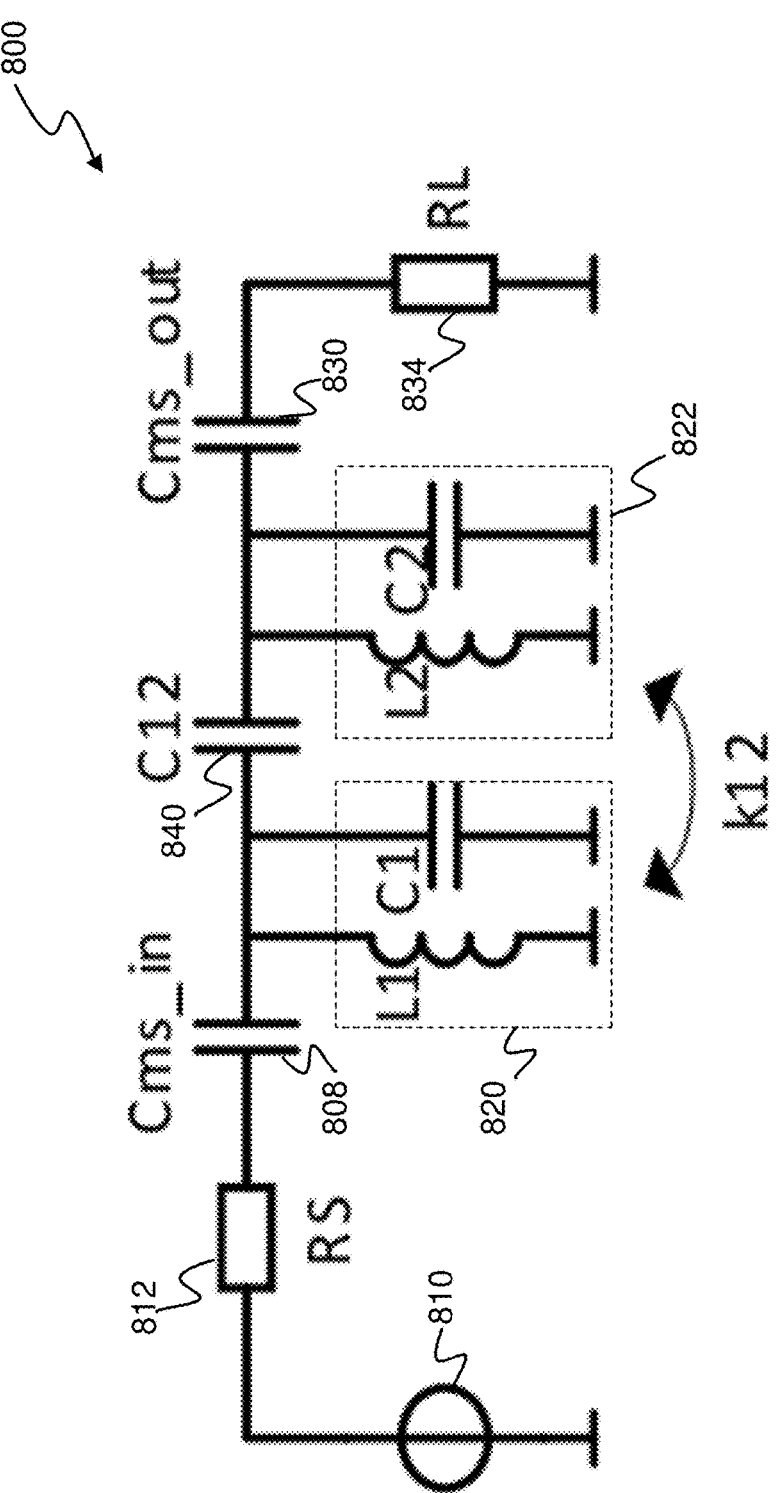
FIG. 8 schematically illustrates a second order coupled resonator filter with both magnetic and electrical coupling in accordance with the disclosure.

FIG. 8 schematically illustrates a second order coupled resonator filter 800 with both magnetic and electrical coupling in accordance with the disclosure. As shown, the filter 800 includes an input matching capacitance 808 (Cms_in) is connected in series with a signal source 810 having a source resistance 812 (RS). The two resonators included within the filter 800 consist of a first resonator 820 and a second resonator 822 formed from the parallel combinations of L1 and C1, and L2 and C2, respectively. The electrical coupling between the two resonators is achieved by the capacitance 840 (C12), and the amount of magnetic coupling is characterized by the coupling factor k12. The filter 800 includes an output matching capacitance 830 (Cms_out) connected in series with a load represented by load resistance 834 (RL).

Figure 9:
FIG. 9 schematically illustrates a second order coupled resonator filter with only magnetic coupling in accordance with the disclosure.
Figure 9:
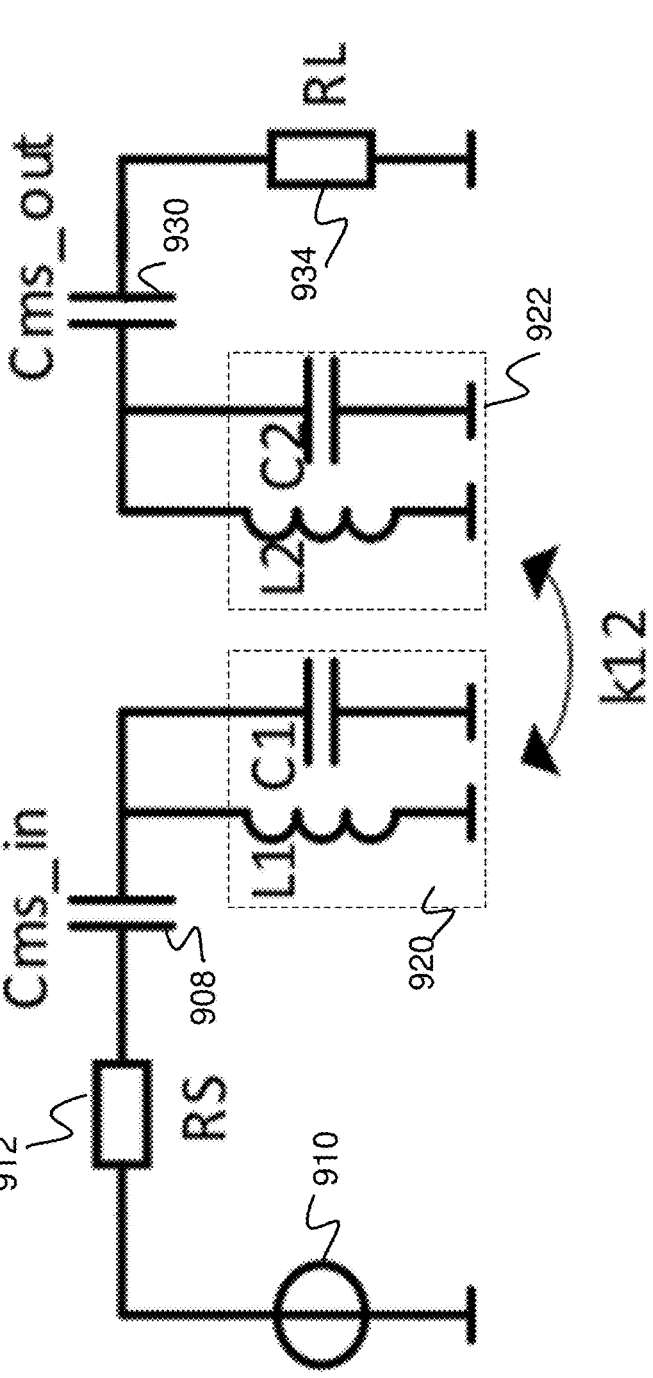

FIG. 9 schematically illustrates a second order coupled resonator filter 900 with only magnetic coupling. The filter 900 includes an input matching capacitance 908 (Cms_in) connected in series with a signal source 910 having a source resistance 912 (RS). The two resonators included within the filter 900 consist of a first resonator 920 and a second resonator 922 formed from the parallel combinations of L1 and C1, and L2 and C2, respectively. As may be appreciated from FIG. 9, the filter lacks a coupling capacitor (i.e., coupling capacitor C12 present in the filter 800 of FIG. 8 is removed) and the frequency response of the filter 900 is achieved with magnetic coupling only. The filter 900 includes an output matching capacitance 930 (Cms_out) connected in series with a load represented by load resistance 934 (RL).

Figure 11:
FIG. 11 illustrates an exemplary layout of inductors included in a third order resonator filter with primarily electric coupling.
Figure 11:
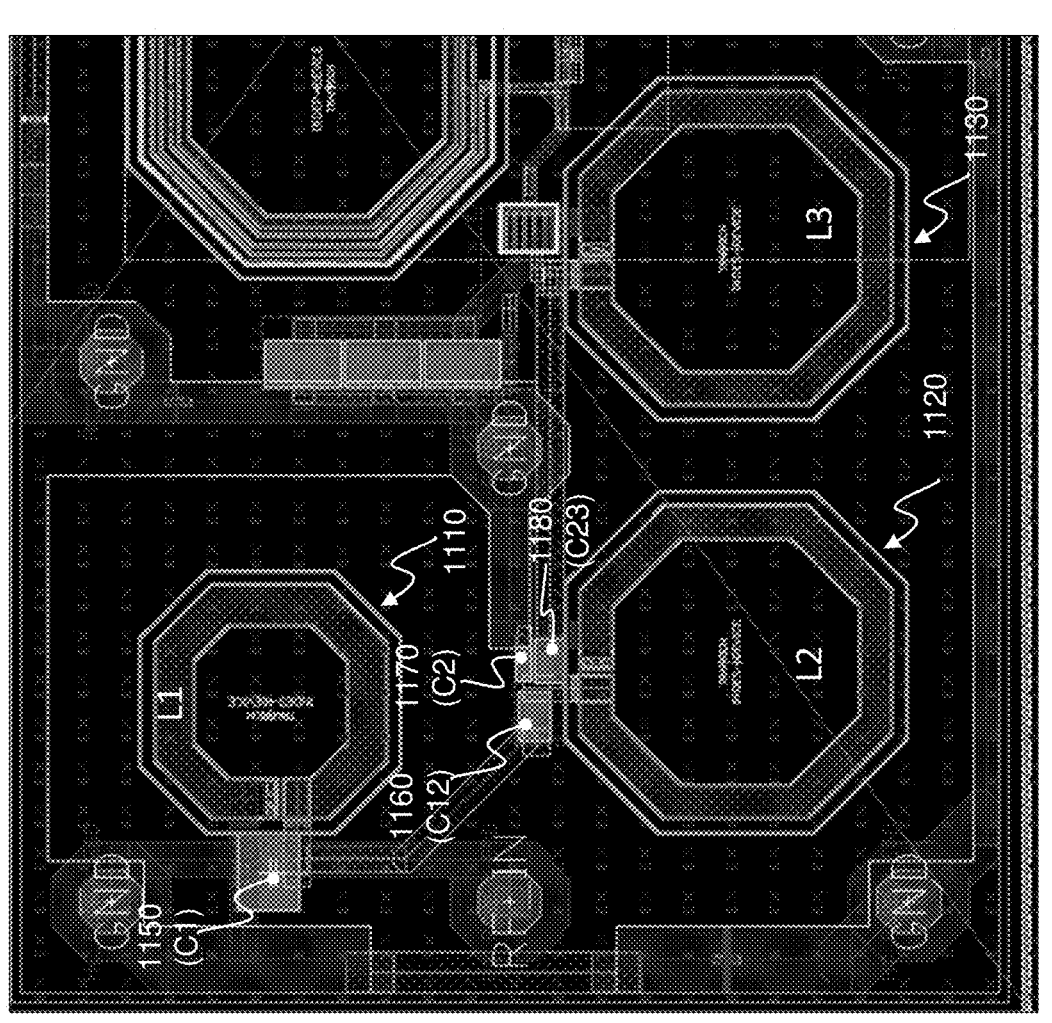

Attention is now directed to FIGS. 11-18, which provide examples of different inductor layouts capable of being utilized to implement coupled resonator filters of the present disclosure. As may be appreciated, there are innumerable ways to implement the layout of inductors resulting in the desired coupling factors between resonators of the coupled resonator filters of the disclosure. As but one example, FIG. 11 illustrates an exemplary layout of inductors included in a third order resonator filter 1100 with primarily electric coupling. As shown, a first inductor 1110 (L1) is included within a first resonator, a second inductor 1120 (L2) is included within a second resonator, and a third inductor 1130 L3 is included within a third resonator, where the reference numerals 1110, 1120, 1130 respectively identify outer boundaries of the layouts of the inductors L1, L2 and L3. As can be seen in this first example, the inductors 1110, 1120, 1130 (L1, L2, L3) of the filter 1100 are separated apart from each other, resulting in a magnetic coupling factor that is small. As a consequence, the resonator coupling is thereby primarily electric and defined by the capacitances between the resonators. In the embodiment of FIG. 11 the coupling factor between the inductors 1110, 1120, 1130 (L1, L2, L3) small (i.e., on the order of 10 m or smaller).

Consistent with the circuit element nomenclature of FIG. 6, the third order resonator filter 1100 of FIG. 11 is seen to include a first capacitance 1150 (C1) proximate the first inductor 1110 (L1). The filter 1100 also includes several capacitance proximate the second inductor 1120 (L2); namely, a second capacitance 1160 (C12), a third capacitance 1170 (C2) and a fourth capacitance 1180 (C23). In the embodiment of FIG. 11, the filter 1100 has been designed such that the capacitance C3 in the third order coupled resonator filter 600 of FIG. 6 has a value of zero and is therefore not shown in the layout of FIG. 11.

Figure 12:
FIG. 12 illustrates an exemplary layout of inductors in a third order resonator filter with combined electric and magnetic coupling.
Figure 12:
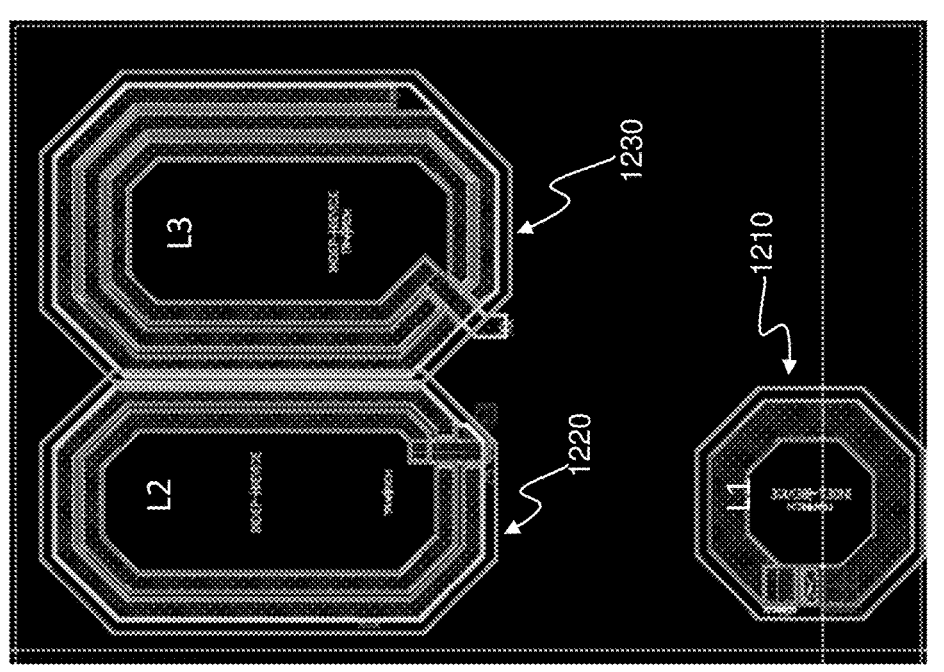

FIG. 12 illustrates an exemplary layout of inductors in a third order resonator filter 1200 with combined electric and magnetic coupling. As shown, a first inductor 1210 (L1) is included within a first resonator, a second inductor 1220 (L2) is included within a second resonator, and a third inductor 1230 (L3) is included within a third resonator, where the reference numerals 1210, 1220, 1230 respectively identify outer boundaries of the layouts of the inductors L1, L2 and L3. In the example of FIG. 12, the second and third inductors 1220, 1230 (L2 and L3) are laid out next to each other, resulting in both electric and magnetic coupling. On the other hand, the first and second resonators are separated by a relatively large distance (i.e., the separation between the first and second inductors 1210, 1220 (L1,L2) is substantially larger than the de minimis separation between the second and third inductors 1220, 1230 (L2, L3). As a consequence, the coupling between the first and second resonators is almost entirely realized by electric coupling. This was corroborated by characterizing the coupling factors between the inductors 1210, 1220, 1230 through electromagnetic simulation which, as expected, yielded nearly entirely electric coupling between the first and second resonators and between the second and third resonators: k12=−7 m, k23=−100 m, and k13=−5 m. The layout of FIG. 12 shows only the three inductances L1, L2, L3 present within the coupled resonator 600 of FIG. 6.

Figure 13:
FIG. 13 illustrates an exemplary layout of a third order resonator filter with combined electric and magnetic coupling.
Figure 13:
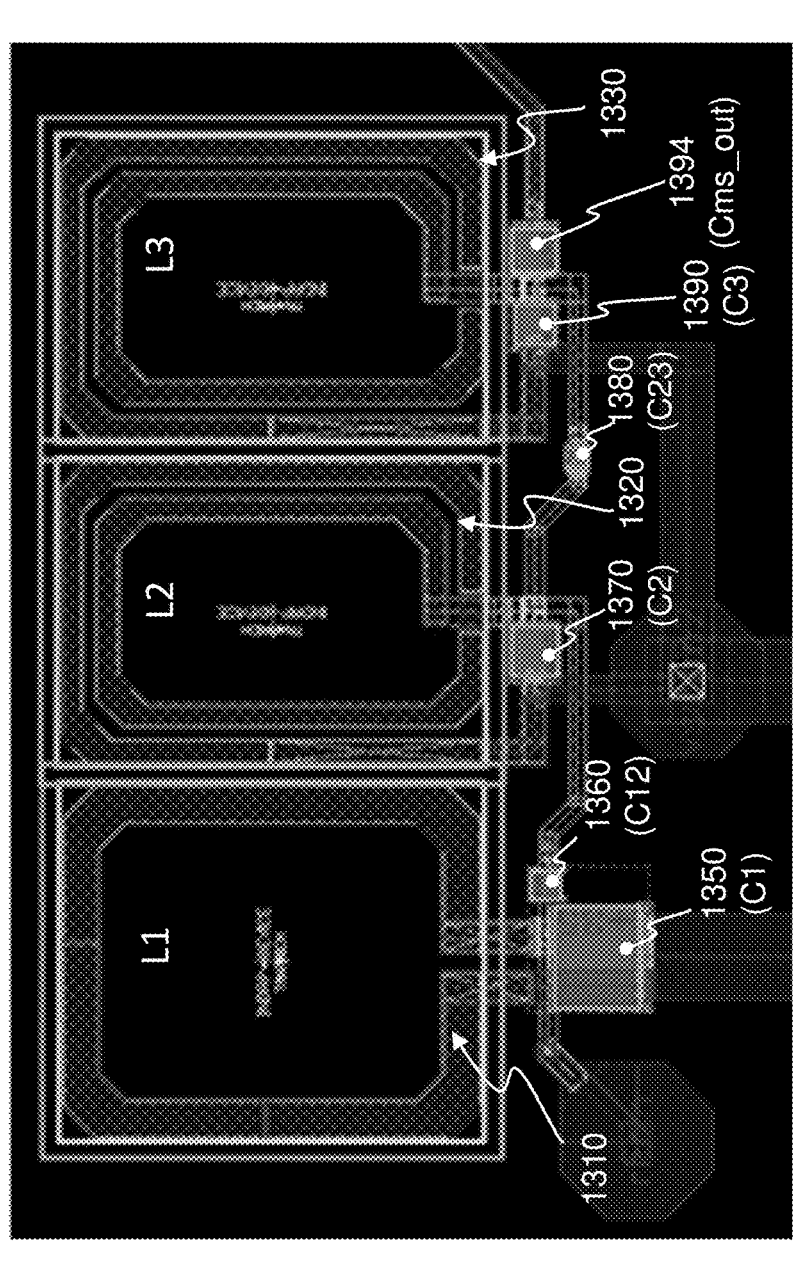

Reference is now made to FIG. 13, which illustrates an exemplary layout of a third order resonator filter 1300 with combined electric and magnetic coupling. As shown, a first inductor 1310 (L1) is included within a first resonator, a second inductor 1320 (L2) is included within a second resonator, and a third inductor 1330 (L3) is included within a third resonator, where the reference numerals 1310, 1320, 1330 respectively identify conductive trace elements of the inductors L1, L2 and L3. In the resonator filter 1300 all three inductors 1310, 1320, 1330 (L1, L2, L3) are laid out immediately adjacent to each other. This proximity between the inductors 1310, 1320, 1330 (L1, L2, L3) results in magnetic coupling between the first, second and third resonators of the filter 1300, which is supplemented with electric coupling to achieve the desired filter transfer function. The coupling factors between the inductors 1310, 1320, 1330 (L1, L2, L3) has been characterized through electromagnetic simulation: k12=−93 m, k23=−111 m, and k13=−10 m. As may be appreciated, the layout of the third order resonator filter 1300 is much more area efficient than the layout of the filter 1100 (FIG. 11).

Consistent with the circuit element nomenclature of FIG. 6, the third order resonator filter 1300 of FIG. 13 is seen to include a first capacitance 1350 (C1) proximate the first inductor 1310 (L1). The filter 1300 also includes a second capacitance 1360 (C12) proximate the first capacitance 1350 (C1) and a third capacitance 1370 (C2) proximate the second inductor 1320 (L2). A fourth capacitance 1380 (C23) is interposed between the inductors 1320, 1330 (L2, L3). A fifth capacitance 1390 (C3) and a sixth capacitance 1394 (Cms_out) are proximate the third inductor 1330 (L3).

Turning now to FIGS. 14-18, there are illustrated coupled resonator filters having layouts which are even more area efficient than the layout of filter 1300. This area efficiency is achieved by laying out the inductors in these filters so as to at least partially overlap each other.

FIG. 14 illustrates an exemplary layout of a third order resonator filter 1400 with only magnetic coupling. A first resonator of the resonator filter 1400 includes a first inductor 1410 (L1), a second resonator includes a second inductor 1420 (L2), and a third resonator includes a third inductor 1430 (L3), where the reference numerals 1410, 1420, 1430 respectively identify conductive trace elements of the inductors L1, L2, L3. The coupling factors between the inductors 1410, 1420, 1430 of the third order resonator filter 1400 have been characterized by electromagnetic simulation as follows: k12=−480 m, k23=−480 m, and k13=−24 m.

Consistent with the circuit element nomenclature of FIG. 6, the third order resonator filter 1400 of FIG. 14 is seen to include a first capacitance 1450 (C1) proximate the first inductor 1410 (L1). The filter 1400 also includes a second capacitance 1460 (C2) interposed between the inductors 1410, 1430 (L1, L3). A third capacitance 1470 (C3) and a fourth capacitance 1480 (Cms_out) are proximate the third inductor 1430 (L3). In the embodiment of FIG. 14, the filter 1400 has been designed such that capacitances C12 and C23 in the third order coupled resonator filter 600 of FIG. 6 have values of zero and are therefore not shown in the layout of FIG. 14.

Figure 15:
FIG. 15 illustrates an exemplary layout of a second order resonator filter with only magnetic coupling.
Figure 15:
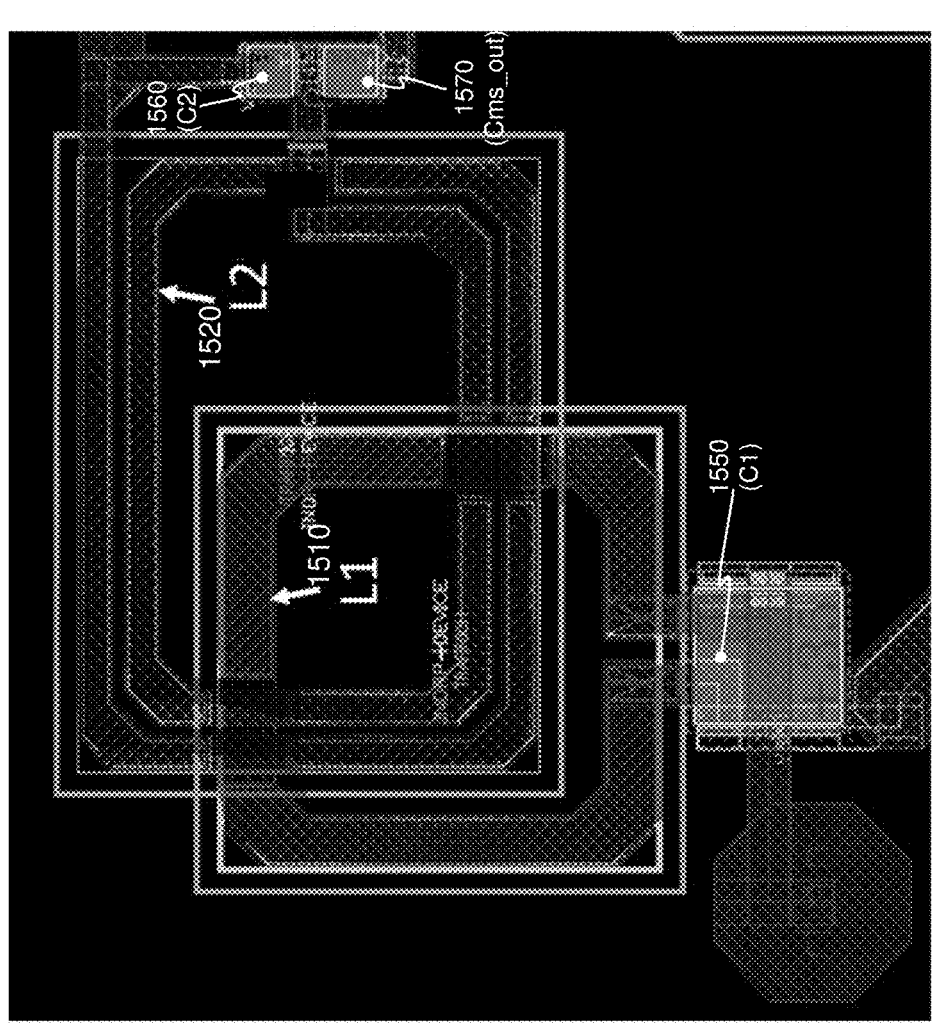

FIG. 15 illustrates an exemplary layout of a second order resonator filter 1500 with only magnetic coupling. A first resonator of the resonator filter 1500 includes a first inductor 1510 (L1) and a second resonator includes a second inductor 1520 (L2), where the reference numerals 1510, 1520 respectively identify conductive trace elements of the inductors L1, L2. The coupling factor, k12, between the inductors 1510 and 1520 of the second order resonator filter 1500 has been characterized by electromagnetic simulation as follows: k12=−240 m. As may be appreciated from FIG. 15, in the filter 1500 the inductors 1510, 1520 (L1, L2) are only partially overlapping to achieve the desired coupling factor between its two resonators.

Consistent with the circuit element nomenclature of FIG. 6, the third order resonator filter 1500 of FIG. 15 is seen to include a first capacitance 1550 (C1) proximate the first inductor 1510 (L1). The filter 1500 also includes a second capacitance 1560 (C2) and a third capacitance 1570 (Cms_out) proximate the second inductor 1520 (L2). In the embodiment of FIG. 15, the filter 1500 has been designed such that capacitance C12 in the third order coupled resonator filter 600 of FIG. 6 has a value of zero and is therefore not shown in the layout of FIG. 15.

Figure 16:
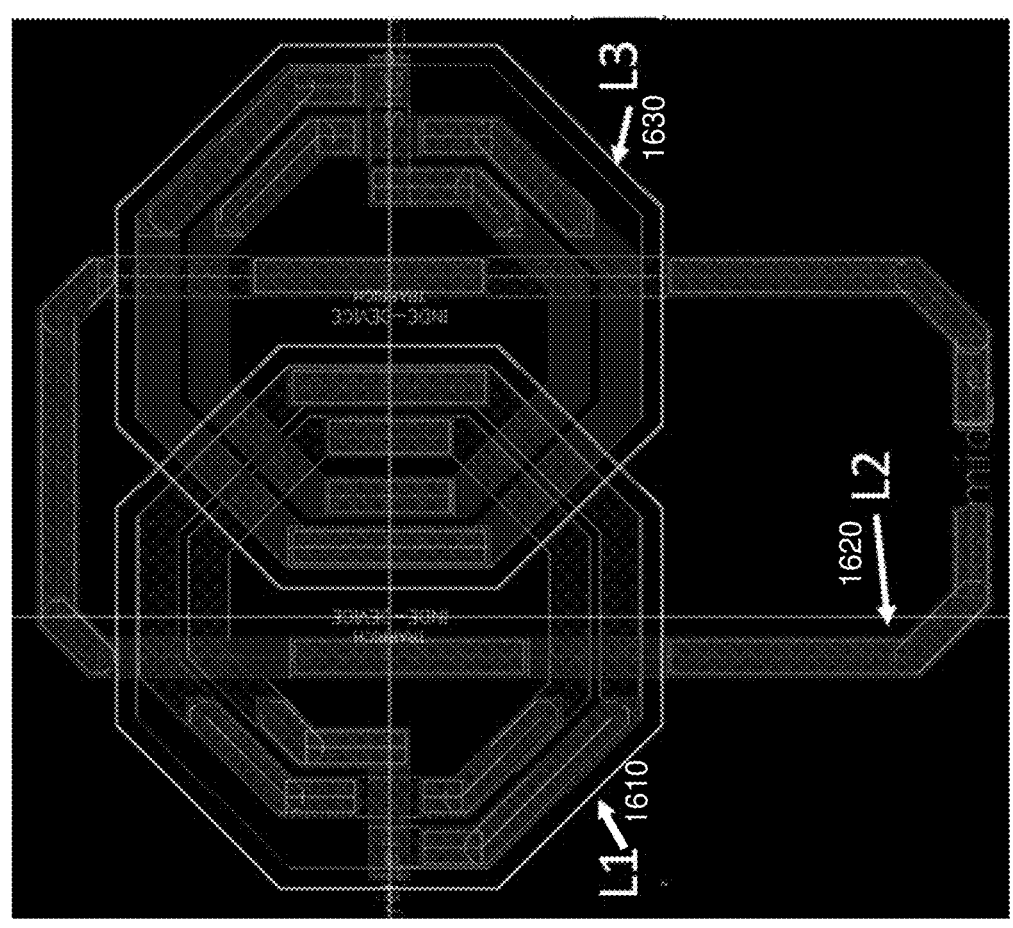
FIG. 16 illustrates an exemplary layout of inductors in a third order resonator filter with only magnetic coupling.

FIG. 16 illustrates an exemplary layout of the inductances of a third order resonator filter 1600 with only magnetic coupling. A first resonator of the resonator filter 1600 includes a first inductor 1610 (L1), a second resonator includes a second inductor 1620 (L2), and a third resonator includes a third inductor 1630 (L3). In FIG. 16 the reference numerals 1610, 1630 respectively identify outer boundaries of the layouts of the inductors L1, L3 and the reference numeral 1620 identifies a conductive trace element of the inductor L2.

Figure 17:
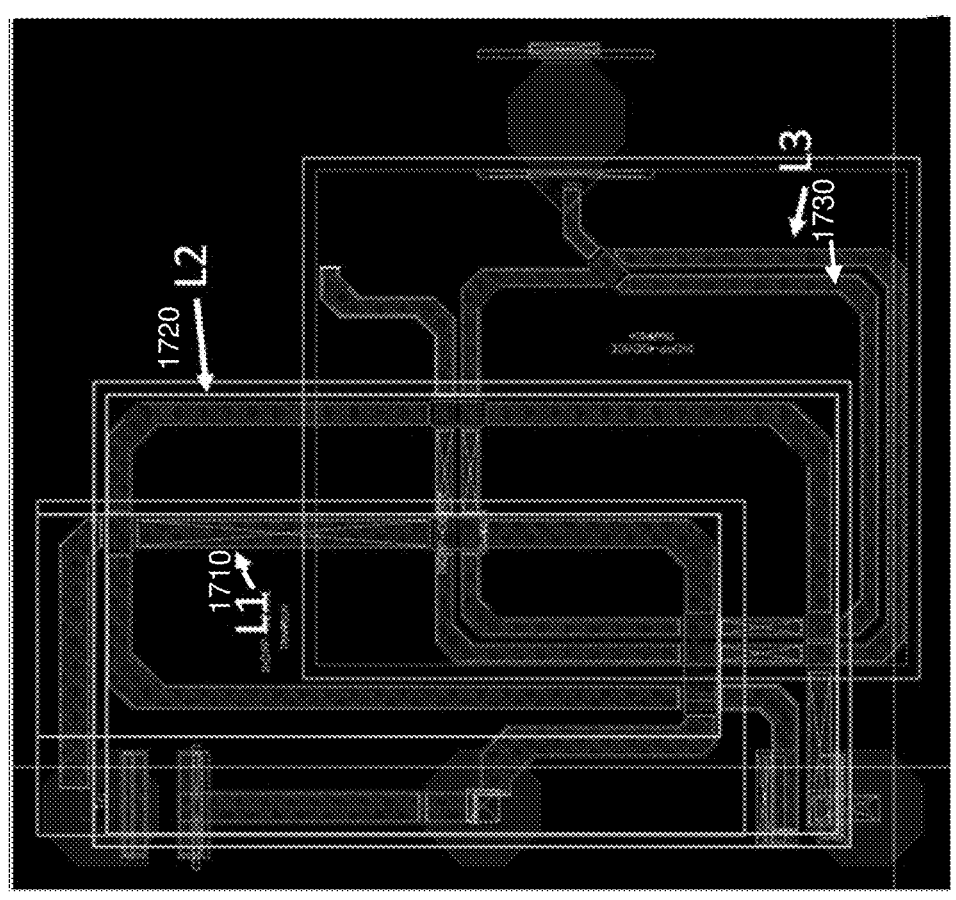
FIG. 17 illustrates an exemplary layout of inductors in a third order resonator filter with only magnetic coupling.
Figure 18:
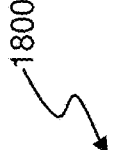
FIG. 18 illustrates an exemplary layout of a third order resonator filter with only magnetic coupling.
Figure 18:
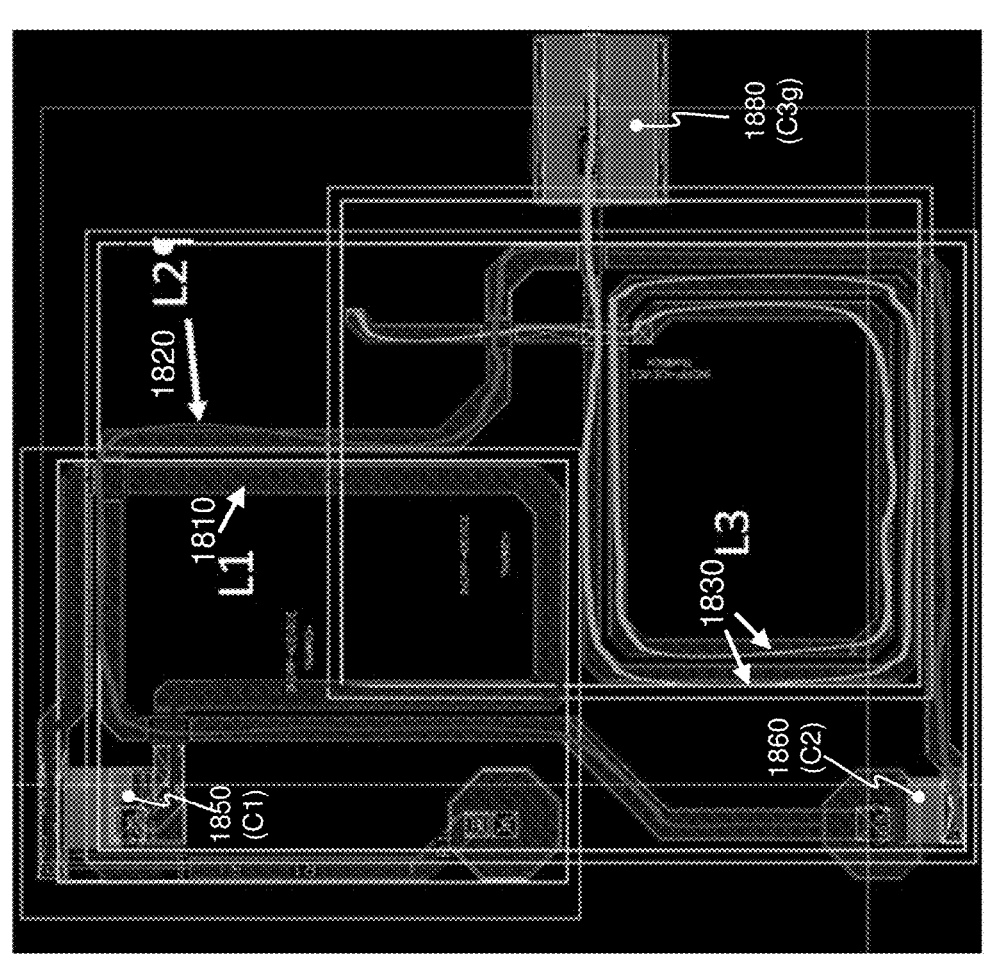

FIG. 17 illustrates an exemplary layout of the inductances of a third order resonator filter 1700 with only magnetic coupling. A first resonator of the resonator filter 1700 includes a first inductor 1710 (L1), a second resonator includes a second inductor 1720 (L2), and a third resonator includes a third inductor 1730 (L3). In FIG. 17 the reference numerals 1710, 1730 respectively identify conductive traces of the layouts of the inductors L1, L3 and the reference and the reference numeral 1720 identifies an outer boundary of the inductor L2. The coupling factors between the inductors 1710, 1720, 1730 of the third order resonator filter 1700 have been characterized by electromagnetic simulation as follows: k12=−297 m, k23=−297 m, and k13=−23 m. The layouts of FIGS. 16 and 17 show only the three inductances L1, L2, L3 present within a third order coupled resonator filter with magnetic coupling; that is, the capacitances within the coupled resonator filters 1600, 1700 are not shown FIG. 18 illustrates an exemplary layout of a third order resonator filter 1800 with only magnetic coupling. A first resonator of the resonator filter 1800 includes a first inductor 1810 (L1), a second resonator includes a second inductor 1820 (L2), and a third resonator includes a third inductor 1830 (L3). In FIG. 18 the reference numerals 1810, 1820, 1830 respectively identify path markings superimposed on conductive traces forming the inductors L1, L3

Consistent with the circuit element nomenclature of FIG. 6, the third order resonator filter 1800 of FIG. 18 is seen to include a first capacitance 1850 (C1) proximate the first inductor 1410 (L1). The filter 1400 also includes a second capacitance 1860 (C2) placed within a bottom left corner of the layout of FIG. 18. A third capacitance (C3) is not shown in FIG. 18 as it corresponds to the input capacitance of an LNA connected to the filter 1800. In the embodiment of FIG. 18, the filter 1800 has been designed such that capacitances C12 and C23 present in the third order coupled resonator filter 600 of FIG. 6 have values of zero and are therefore not shown in the layout of FIG. 18. A fourth capacitance 1880 (C3g) is placed in series with the ground connection of the third inductor 1830 (L3), which generates an additional notch.

Figure 19:
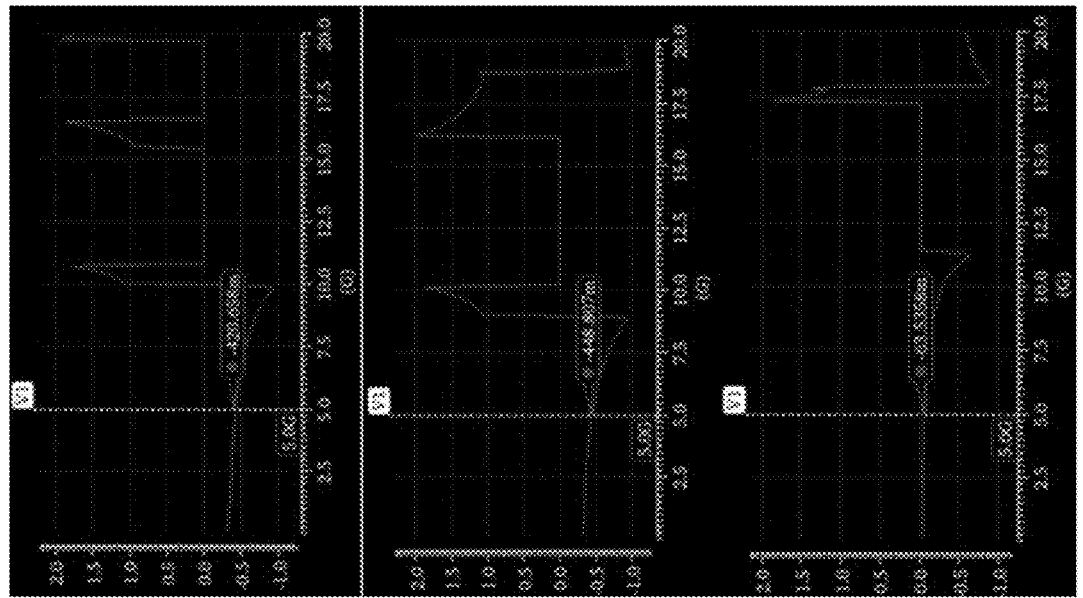
FIG. 19 illustrates results of an electromagnetic simulation characterizing the coupling factor between inductors of the layout in FIG. 18.

FIG. 19 illustrates results of electromagnetic simulation of the third order resonator filter 1800 of FIG. 18. Specifically, FIG. 19 shows a first coupling factor k12 between the inductors L1 and L2 in the filter 1800, a second coupling factor k23 between the inductors L2 and L3, and a third coupling factor k13 between the inductors L1 and L3. As may be appreciated from FIG. 19, it can be seen that the magnetic coupling is strong between adjacent overlapping resonators and weak between non-adjacent resonators; that is, k12 and k23 are relatively large in view of the substantial overlap between L1/L2 and L2/L3, and k13 is relatively small in view of the lack of overlap between L1 and L3. This is consistent with the results of electromagnetic simulation of the coupling factors of FIG. 19: k12=−420 m, k23=−448 m, and k13=−63 m.

Besides being area efficient, another advantage of the magnetic-only coupled resonator filters described herein is that it is easy to program the center frequency and bandwidth of such filers. As the capacitors are connected to the filter in a shunt fashion, it is thereby straightforward to add additional capacitance by ground connected MOS switches in order achieve desired center frequency and bandwidth parameters.

When magnetic coupling is introduced between the first and third inductor of a coupled resonator filter of the present disclosure, the signal that is fed to the output with magnetic coupling between the first and last inductor will be added with the signal that is fed via the second, middle inductor. At a specific frequency these two signals will be added with opposite phase, which results in a notch at that specific frequency.

Figure 20:
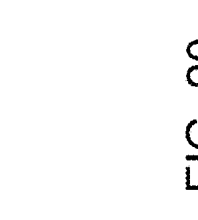
FIG. 20 illustrates a typical frequency response of a third order resonator filter.
Figure 21:
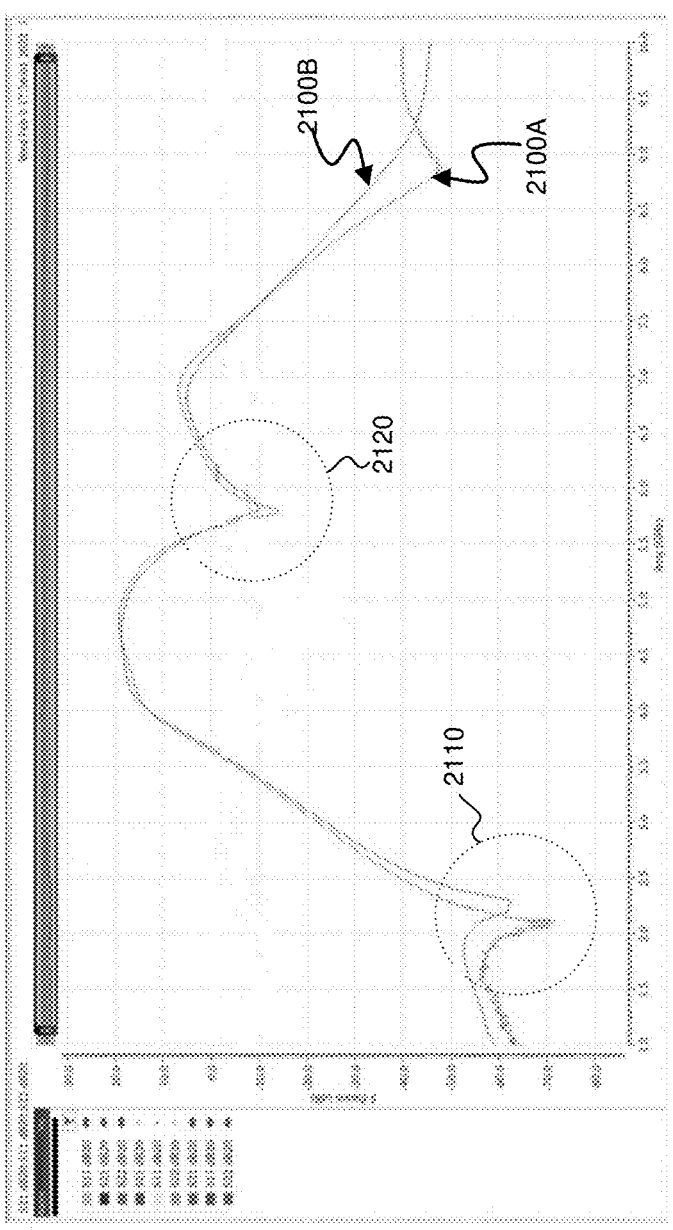
FIG. 21 illustrates both simulated and measured frequency responses of the receiver of FIG. 5B as implemented with a third order resonator filter configured to introduce frequency response notches in accordance with the disclosure.

Reference is now made to FIG. 20, which illustrates a typical notched frequency response 2000 of a circuit including a third order resonator filter and an LNA. In FIG. 20 it is noted that the response 2000 includes the gain from the LNA, which is approximately 20 dB. As shown in the frequency response 2000 of FIG. 20, a frequency response notch 2010 is tuned to be located at 2.5 GHz. The location of this frequency response notch can be selected by choosing an appropriate magnetic coupling between the first and last resonator, i.e., between the resonators including L1 and L3 within the coupled resonator filters described herein. Turning to FIG. 21, a comparison is shown between the measured and simulated frequency responses 2100A and 2100B of the receiver of FIG. 5 as implemented with a coupled resonator filter configured to generate a notched frequency response. As shown, the measured and simulated frequency responses 2100A and 2100B each includes first and second frequency response notches 2110 and 2120. In accordance with the disclosure, the relative signs (polarities) of the coupling factors of the coupled resonator filter are set to certain relative values in order to effect the signal path cancellation necessary to produce this notched frequency response. That is, unless coupling between the various inductors within the coupled resonator is of the correct sign such signal cancellation will not occur and notches will not be created in the frequency response. For example, in the embodiment of FIG. 18 the filter 1800 is configured such that all coupling factors (k12, k23, k13) are negative. However, if the filter 1800 had been configured such that the coupling from the first to the last resonator (k13) would have been chosen to have opposite sign while keeping k12 and k23 negative, a frequency response notch such as the notch 2010 of FIG. 20 would not have been present in the frequency response of the filter 1800. Rather, configuring a resonator filter to have k12 with opposite sign would require k13 to be positive in order to achieve the signal path cancellation necessary to produce a notched frequency response. Finally, it should be mentioned that the input impedance of the LNA loading the filter can be chosen arbitrarily as matching between the source impedance and the LNA input impedance can be included in the filter. It is thereby possible to design an LNA with an input impedance which is optimal from noise point of view.

More generally, it has been found that a frequency response of the coupled resonator filters described herein include a notch when values of the first coupling factor, the second coupling factor and the third coupling factor satisfy predetermined conditions. The predetermined conditions include a condition that the first coupling factor, the second coupling factor and the third coupling factor are negative. The predetermined conditions also include a condition that the first coupling factor and the second coupling factor are positive, and the third coupling factor is negative. The predetermined conditions further include a condition that the first coupling factor and the second coupling factor are of opposite polarity and the third coupling factor is positive. A condition that an absolute value of the first coupling factor and the second coupling factor is greater than 0.25 and an absolute value of the third coupling factor is less than 0.25 is also included among the predetermined condition. It has further been found that such a notch is included in the frequency response of the coupled resonator filter at a frequency dependent upon the value of the third coupling factor and a product of the first coupling factor and the second coupling factor.

Finally, it should be mentioned that the input impedance of an LNA loading the coupled resonator filter can be chosen arbitrarily. This is because the filter can be designed to include matching to match the source impedance and the LNA input impedance. It is thereby possible to design an LNA with an input impedance which is optimal from a noise point of view.

On-Chip Coupled Resonator Filters Combined with LNA

Figure 22:
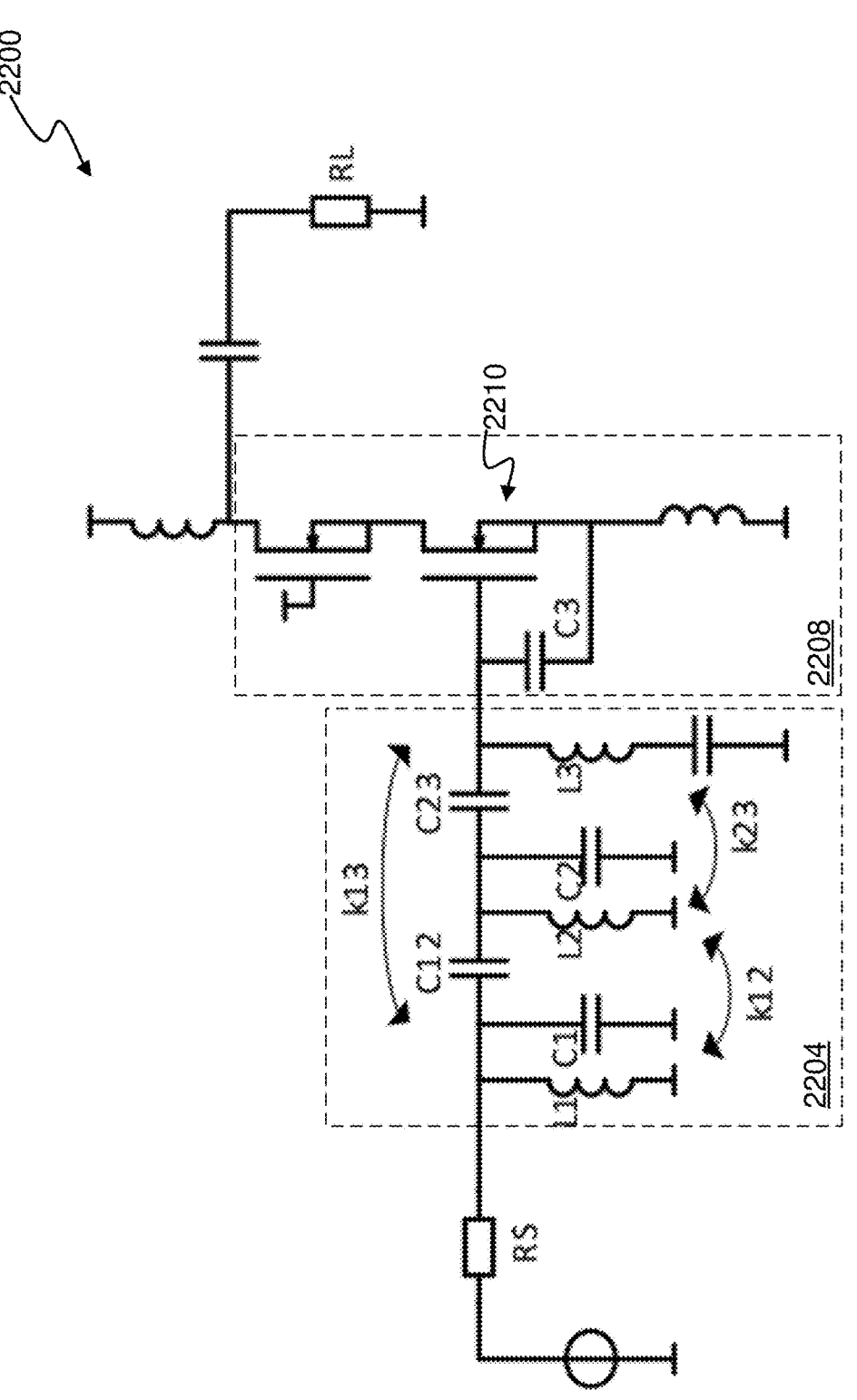
FIG. 22 schematically illustrates a coupled resonator filter combined with source degenerated LNA in accordance with the disclosure.
Figure 23:
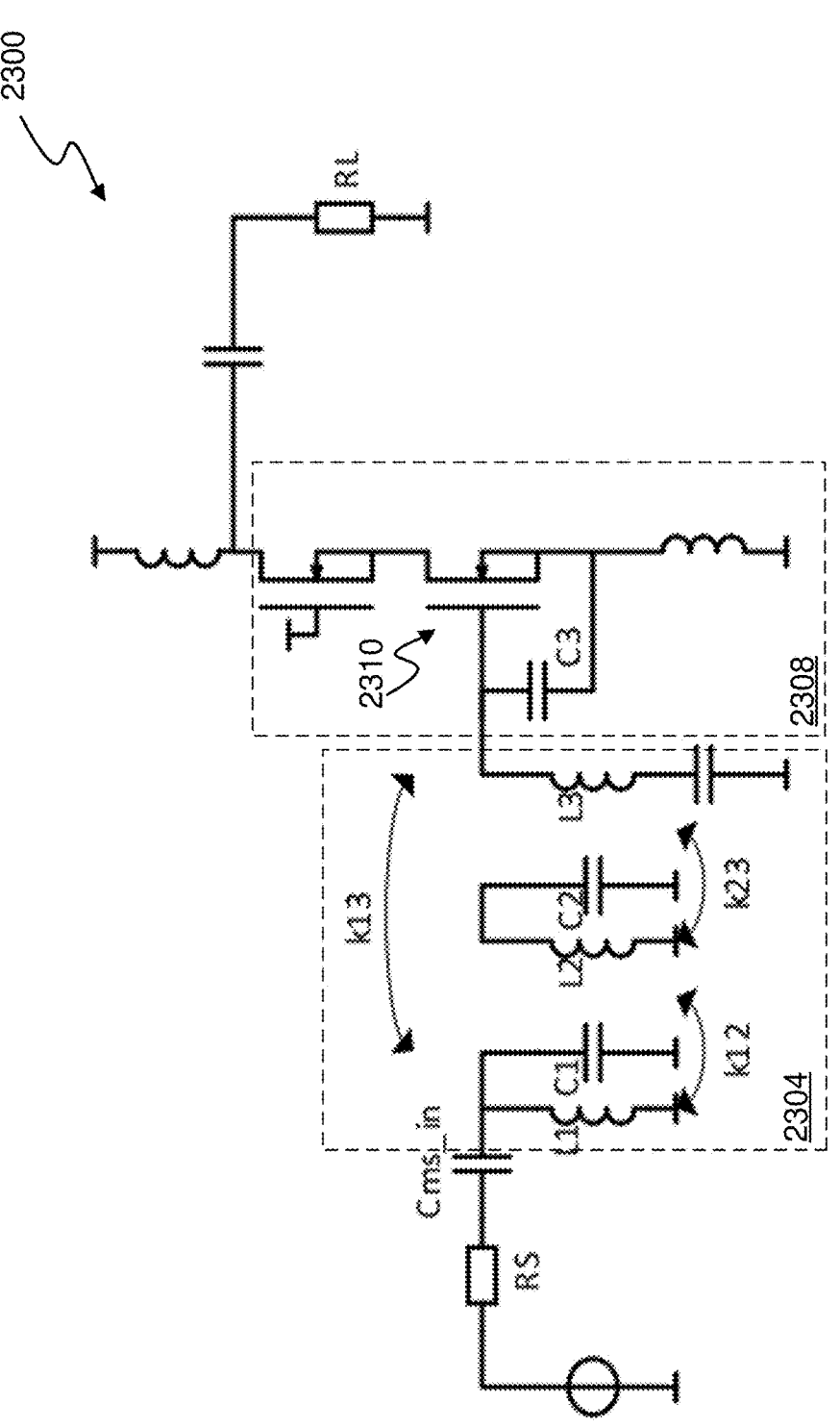
FIG. 23 schematically illustrates a magnetically-only coupled resonator filter combined with a source degenerated LNA.

Attention is now directed to FIGS. 22 and 23, which illustrate active filter circuits 2200 and 2300. As shown in FIG. 22, the active filter circuit 2200 is comprised of a coupled resonator filter 2204 combined with source degenerated LNA 2208. Similarly, in FIG. 23 the active filter circuit 2300 is seen to include a coupled resonator filter 2304 and a source degenerated LNA 2308. It has been found that when the on-chip coupled resonators described herein are connected to a conventional source-degenerated LNA 300 of the type shown in FIG. 3, the gate capacitance of the input stage 310 of the LNA 300 may be used as the capacitance in the third resonator of coupled resonator filters. See, e.g., capacitance C3 in the circuits 2200 (FIG. 22) and 2300 (FIG. 23). Making the input device 2210, 2310 of the LNA an integral part of the filters 2200, 2300 advantageously improves noise performance and reduces die area. A bias voltage is applied to the gate of input devices 2210, 2310 through the inductance L3.

Figure 1:
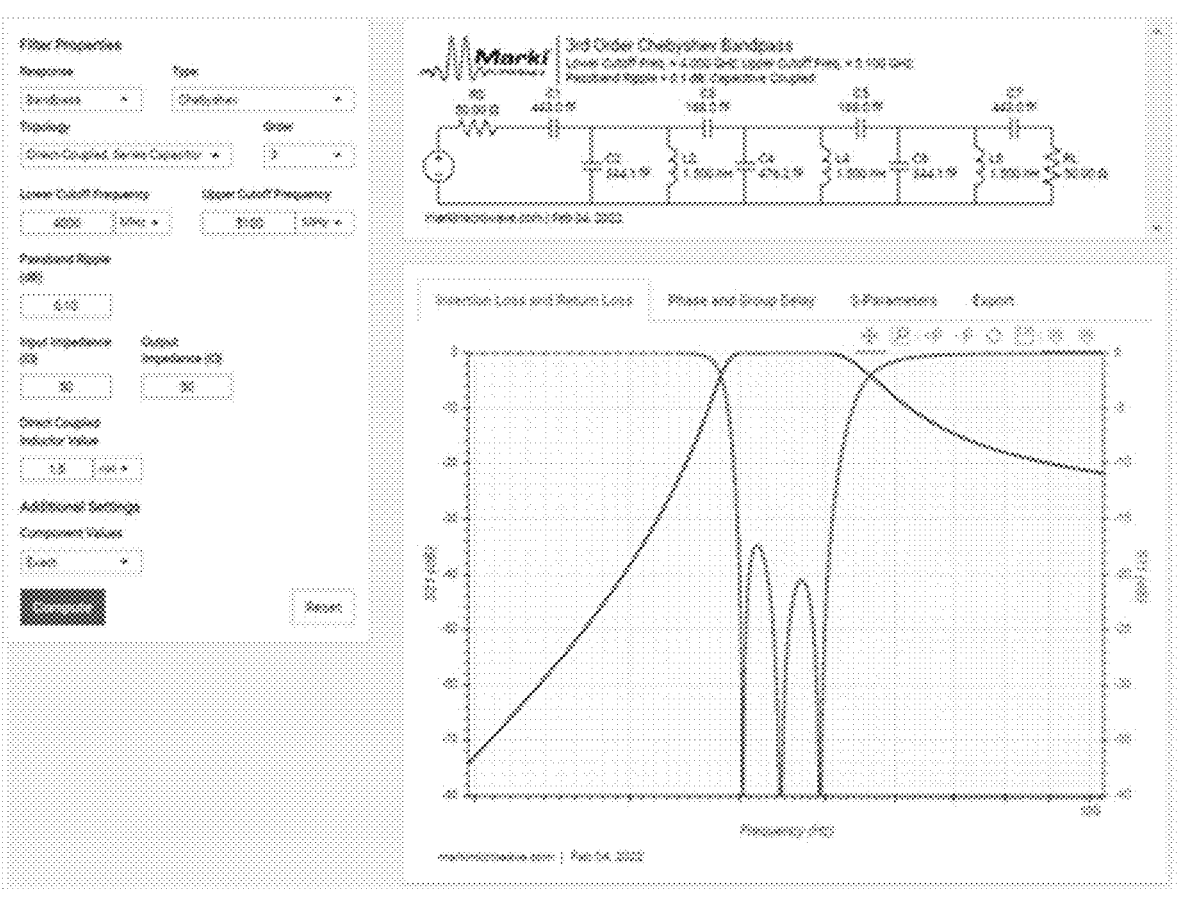
FIG. 1 is a screen shot of an exemplary user interface generated by an online coupled resonator filter calculator.
Figure 2:
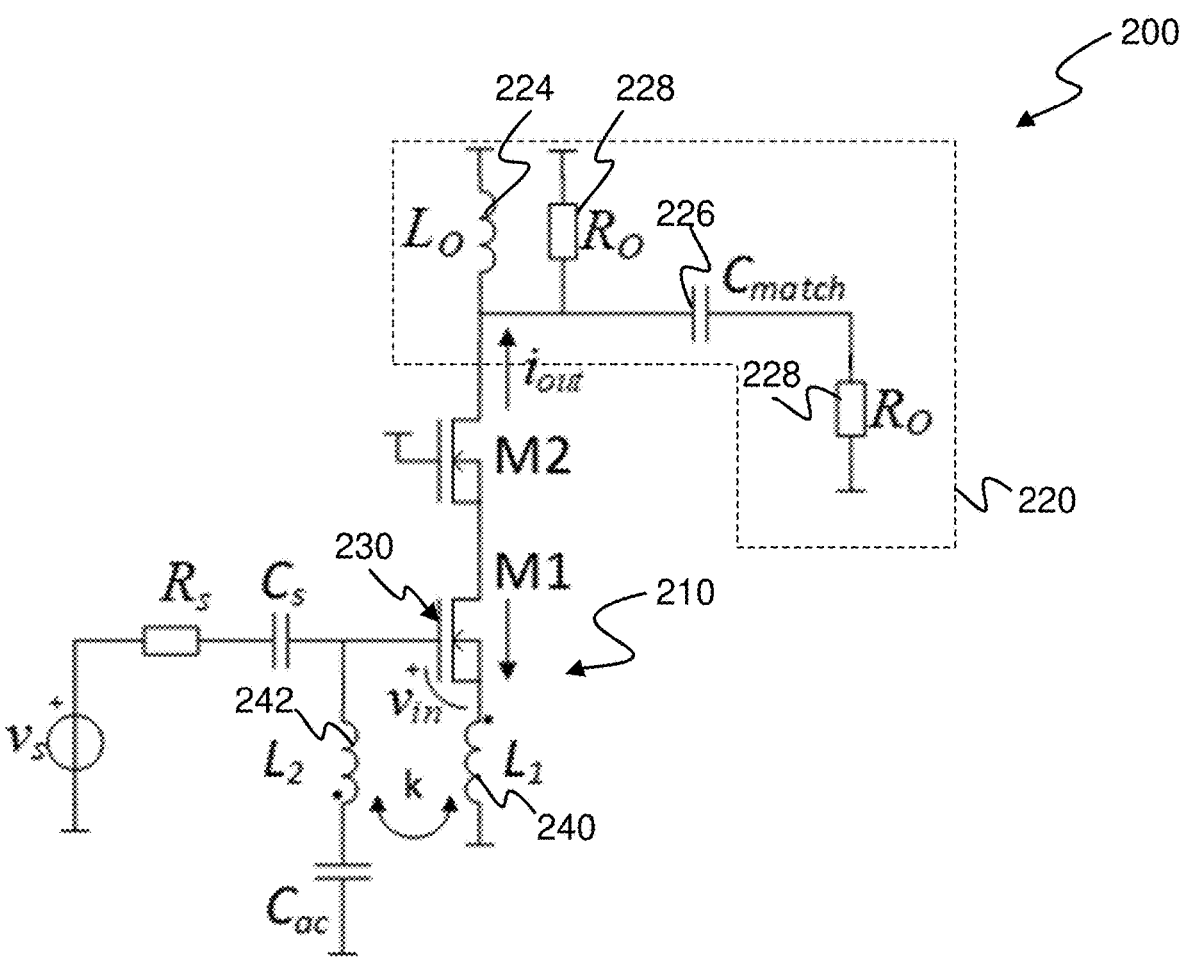
FIG. 2 illustrates an exemplary topology of a source-gate feedback low-noise amplifier (LNA).

FIG. 2 illustrates a source-gate feedback LNA topology 200 capable of being used as an alternative to the source degenerated LNA topology of, for example, FIGS. 22 and 23. An exemplary circuit implementing this technology is depicted in FIG. 24, which schematically illustrates active filter circuit 2400.

Figure 24:
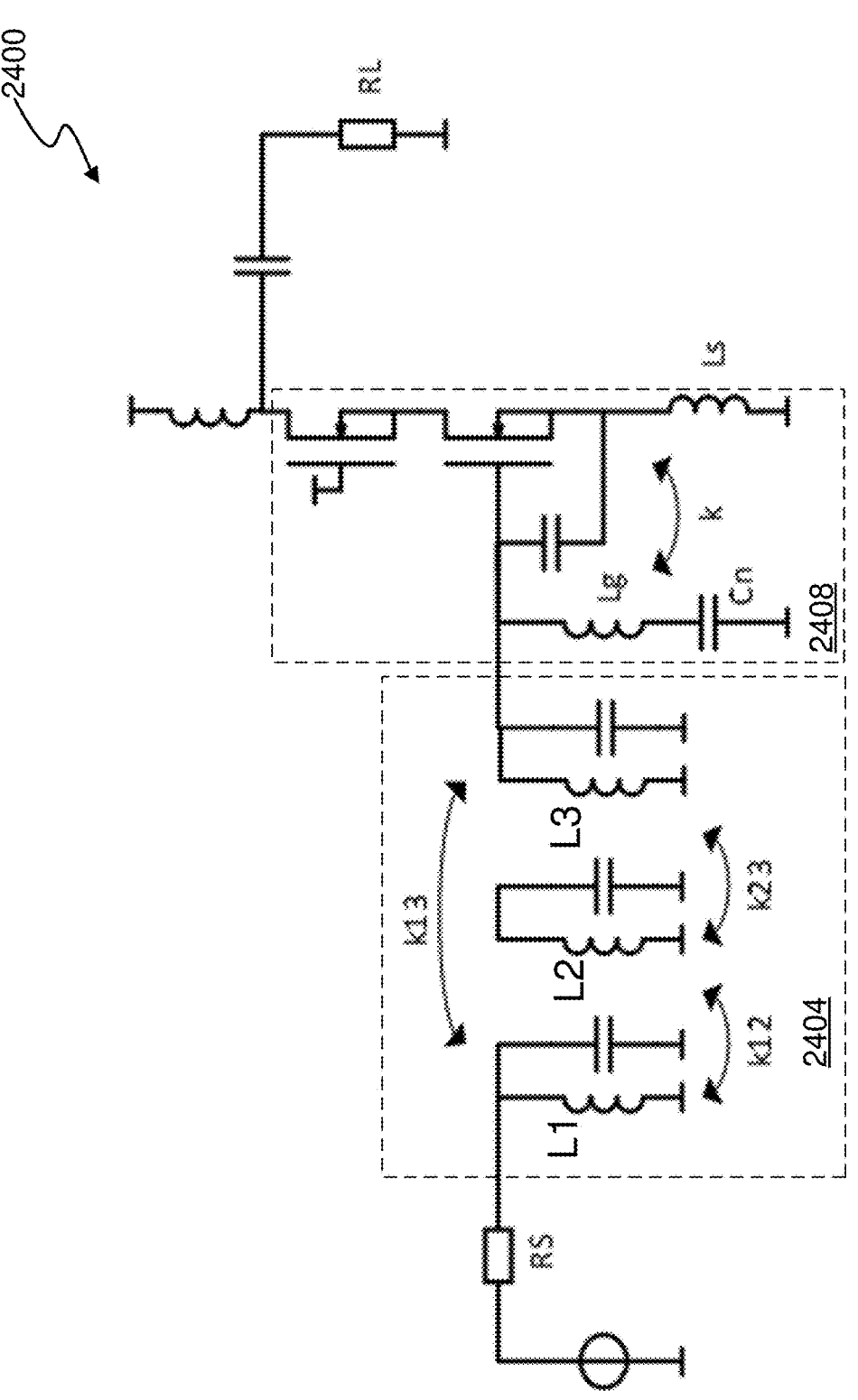
FIG. 24 schematically illustrates a magnetically-only coupled resonator filter combined with a source-gate feedback LNA.

Turning to FIG. 24, the active filter circuit 2400 is comprised of a coupled resonator filter 2404 combined with a source-gate feedback LNA 2408. As may be appreciated from FIG. 24, the coupled resonator filter 2404 relies upon only magnetic coupling; that is, the values of the coupling coefficients k12, k13, k23 are determined exclusively by the configuration of the inductive elements L1, L2, L3 within the filter 2404.

Figure 31:
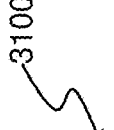
FIG. 31 schematically illustrates a CMOS implementation of source-gate feedback LNA topology.
Figure 31:
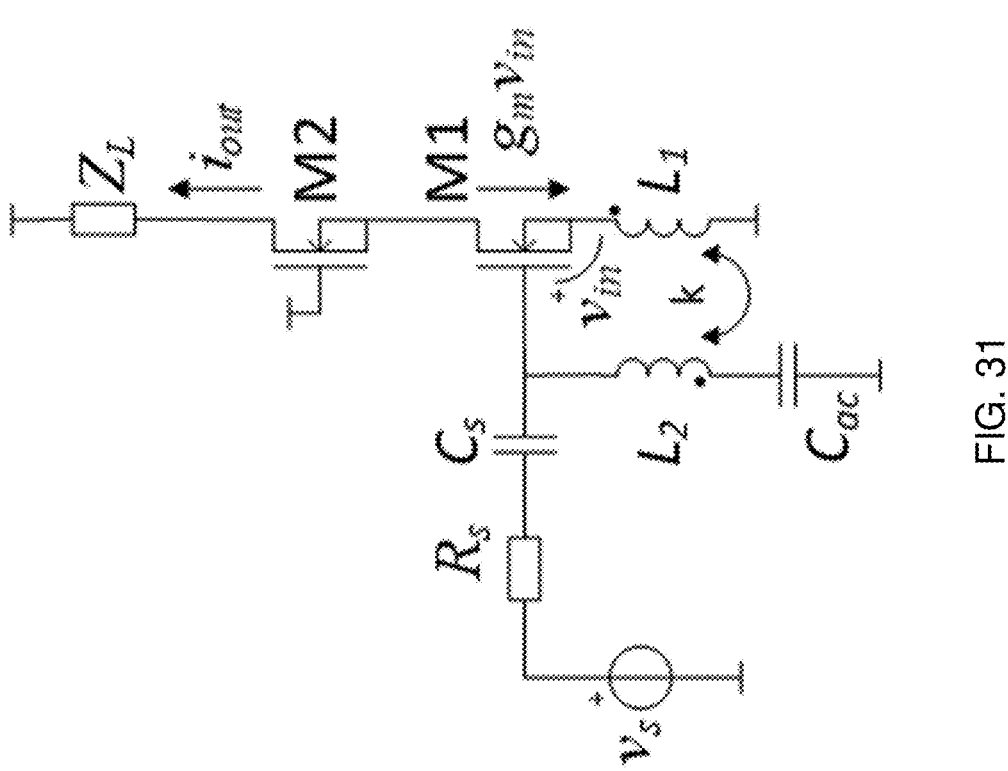
Figure 33:
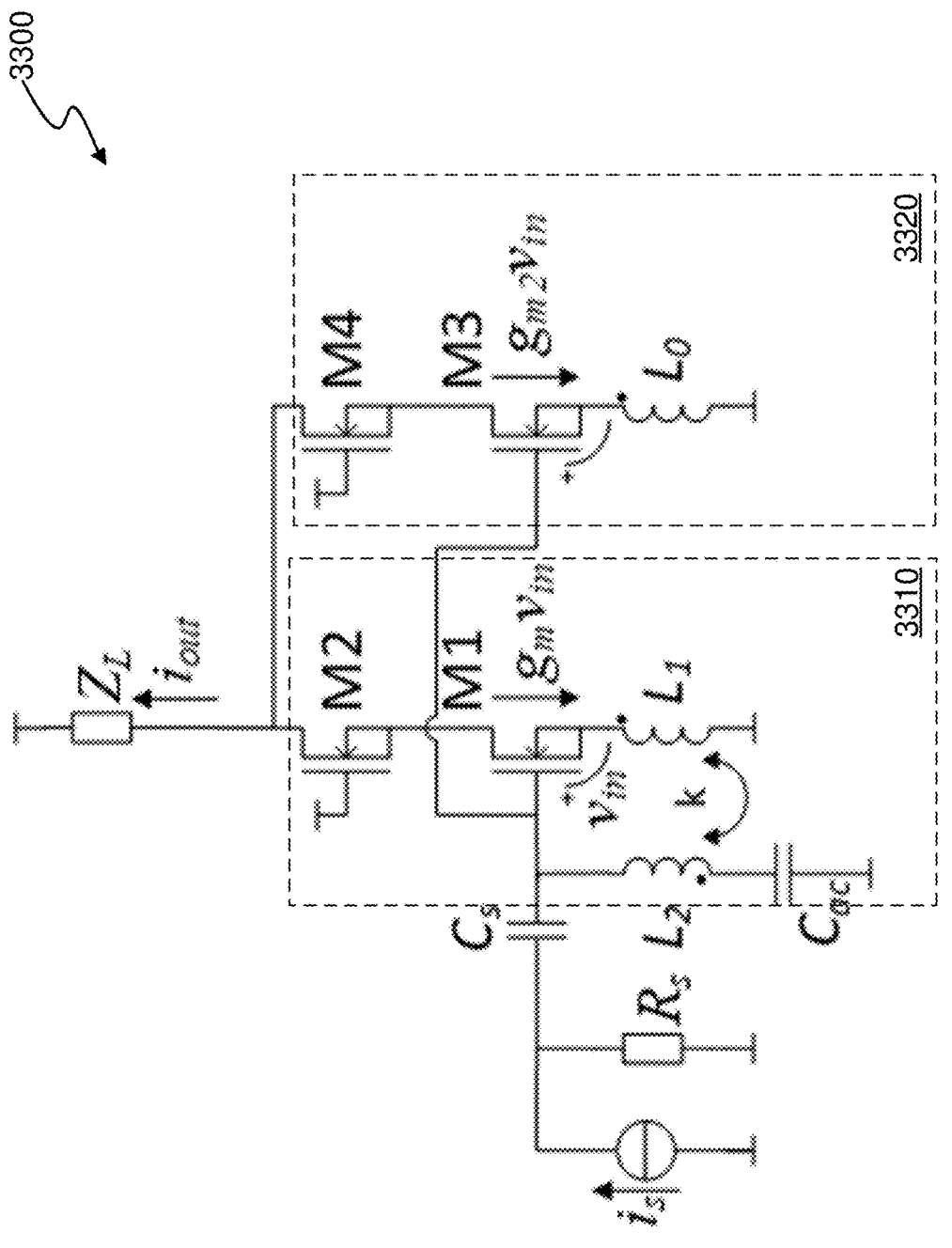
FIG. 33 schematically illustrates a CMOS implementation of source-gate feedback LNA topology configured for distortion cancelling.

FIGS. 31 and 33 illustrate exemplary CMOS implementations of source-gate feedback LNA topologies 3100, 3300 capable of being utilized as alternatives to the source degenerated topologies described herein. In the exemplary implementation of FIG. 33, the exemplary topology 3300 is configured for distortion cancelling and includes a source-gate feedback LNA 3310 and a distortion canceling network 3320.

Figure 26:
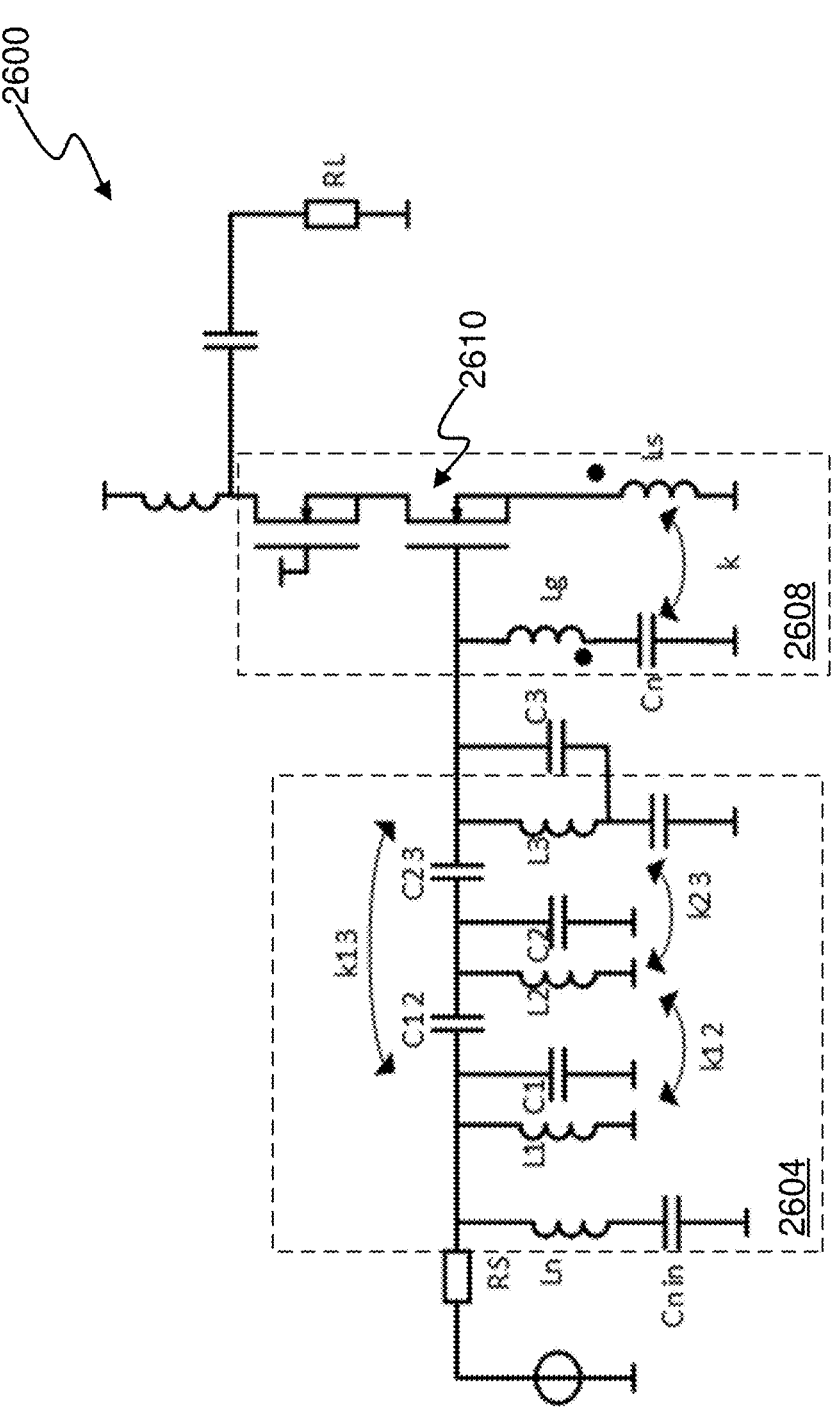
FIG. 26 schematically illustrates a coupled resonator filter combined with source-gate feedback LNA and an input notch circuit.

FIG. 26 schematically illustrates an active filter 2600 having a coupled resonator filter 2604 combined with a source-gate feedback LNA 2608 that is configured to produce a frequency response having an input notch circuit (Ln, Cn in). As shown, the input notch circuit (Ln, Cn in) is connected to the input source and may be utilized in cases in which additional low frequency attenuation is required.

Figure 28:
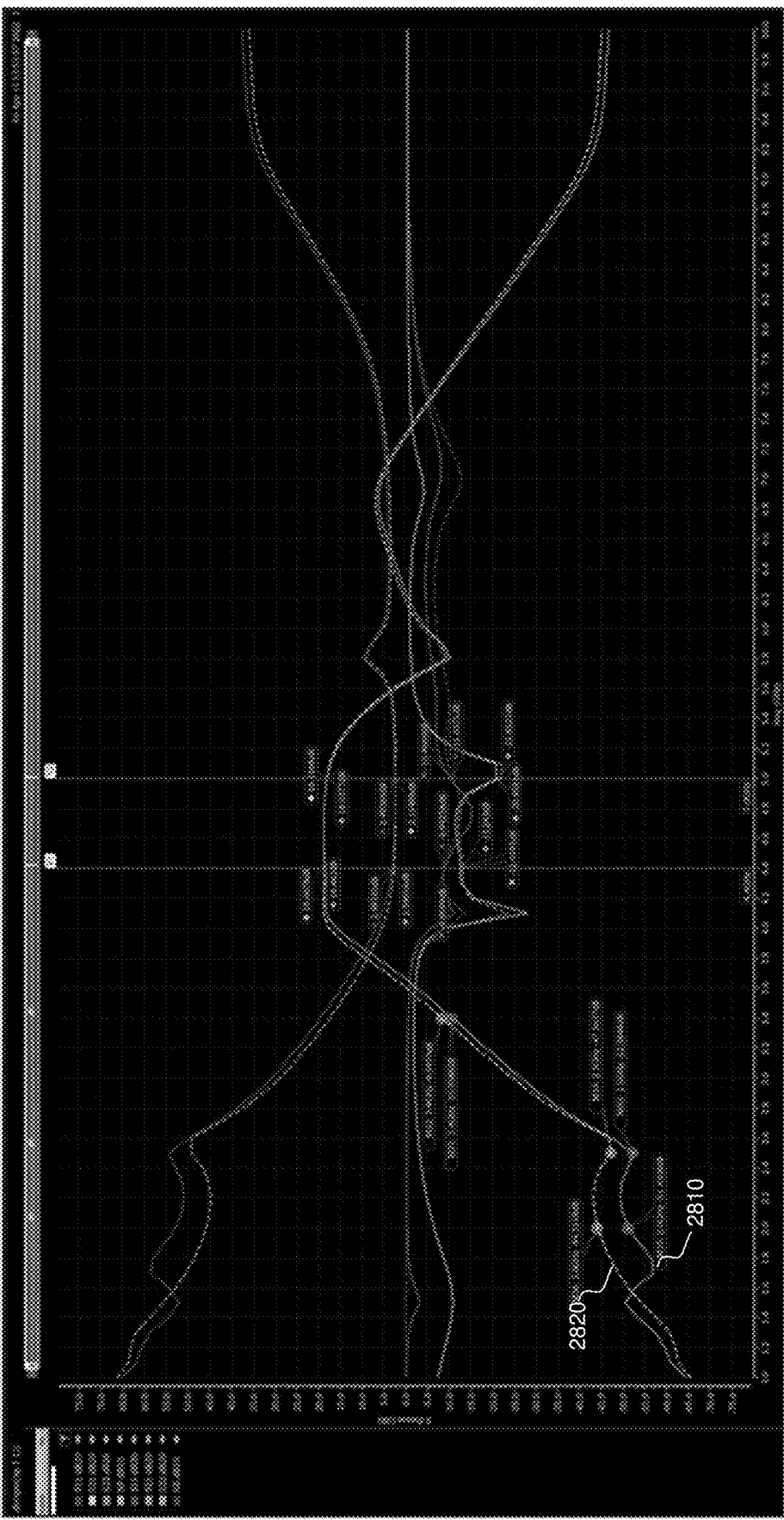
FIG. 28 illustrates a frequency response of a filter and LNA implementation with and without an additional input notch.

FIG. 28 illustrates a frequency response of a filter and LNA implementation with and without an additional input notch circuit; that is, the frequency response 2810 of a filter having the topology of the active filter 2600 and the frequency response 2820 of a substantially identical filter lacking an input notch circuit (Ln, Cn in). In the case of FIG. 28 the active filter 2600 was implemented by selecting the values of the notch circuit (Ln, Cn in) such that the input notch in the frequency response occurred at around 1.7 GHz. As may be appreciated from FIG. 28, this results in an improvement of the low frequency attenuation as illustrated in FIG. 28 (compare the frequency response 2820 (dotted yellow graph) with the frequency response 2810 (orange graph)). When a source-gate feedback topology is used in the LNA, a second frequency response notch can be created by adding a notch circuit comprised of a capacitor in series with the gate inductance of the LNA. See, e.g., active filter

Figure 25:
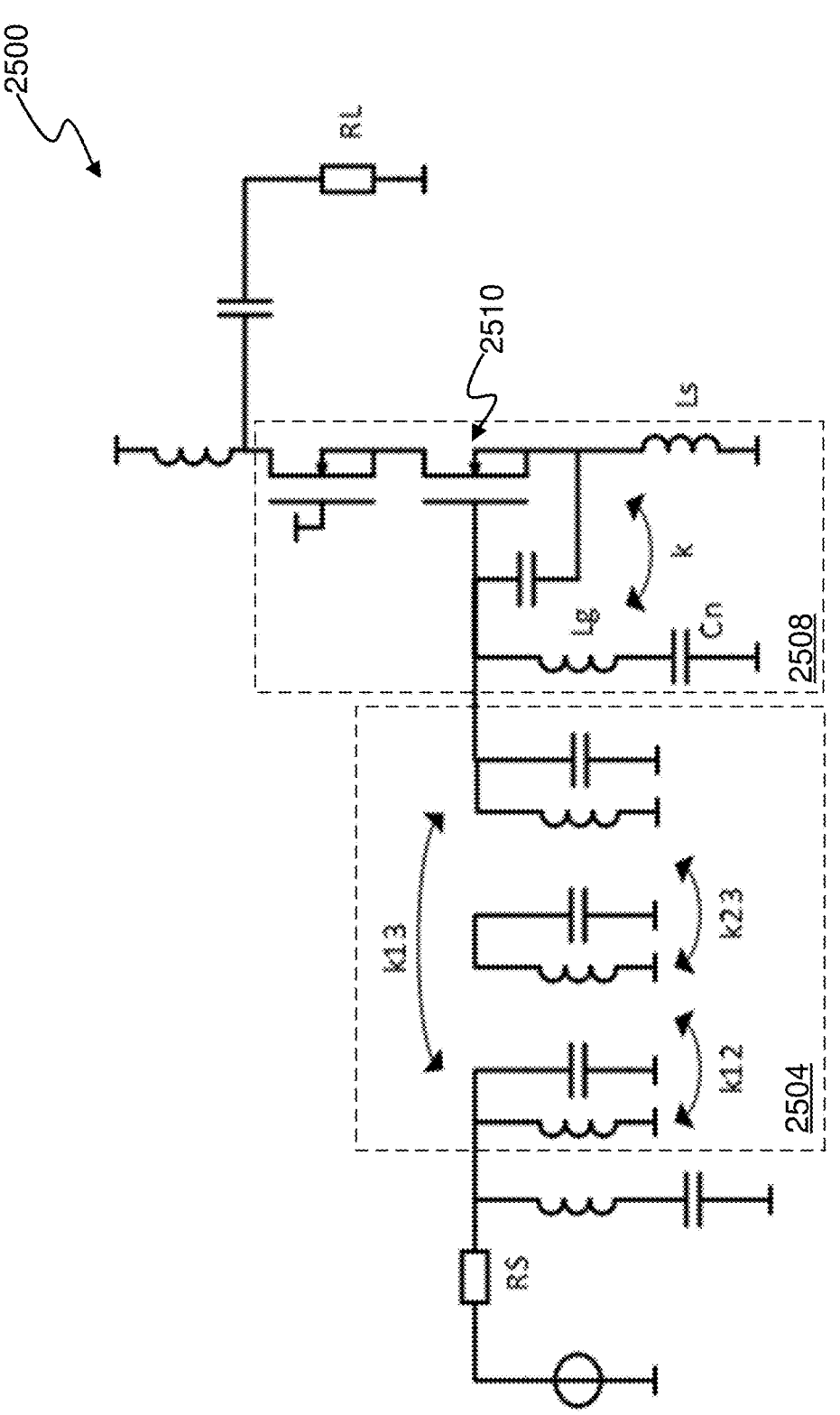
FIG. 25 schematically illustrates a magnetically-only coupled resonator filter combined with a source-gate feedback LNA and configured to produce a frequency response having an input notch.
Figure 27:
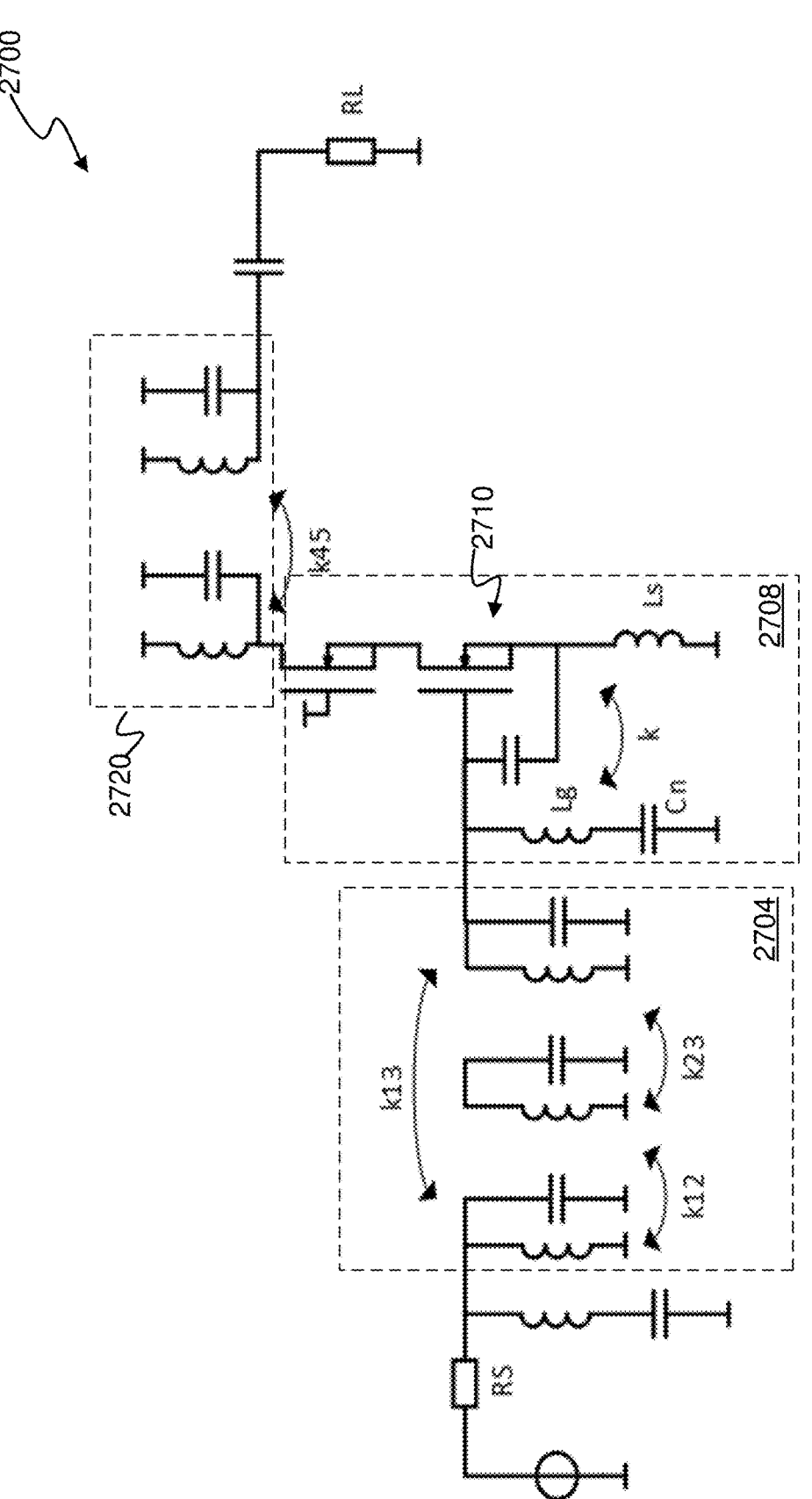
FIG. 27 schematically illustrates a magnetically-only coupled resonator filter combined with source-gate feedback LNA, input notch circuit, and magnetically only coupled resonator filter at the output.

17 circuits 2500, 2600, 2700 of FIGS. 25-27 in which notch capacitance Cn is connected in series with the inductance Lg of the gate of each LNA input device 2510, 2610, 2710.

Referring to FIG. 25, the active filter 2500 includes a magnetically only coupled resonator filter 2504 combined with a source-gate feedback LNA 2508 and an input notch circuit (Lg, Cn).

Figure 29:
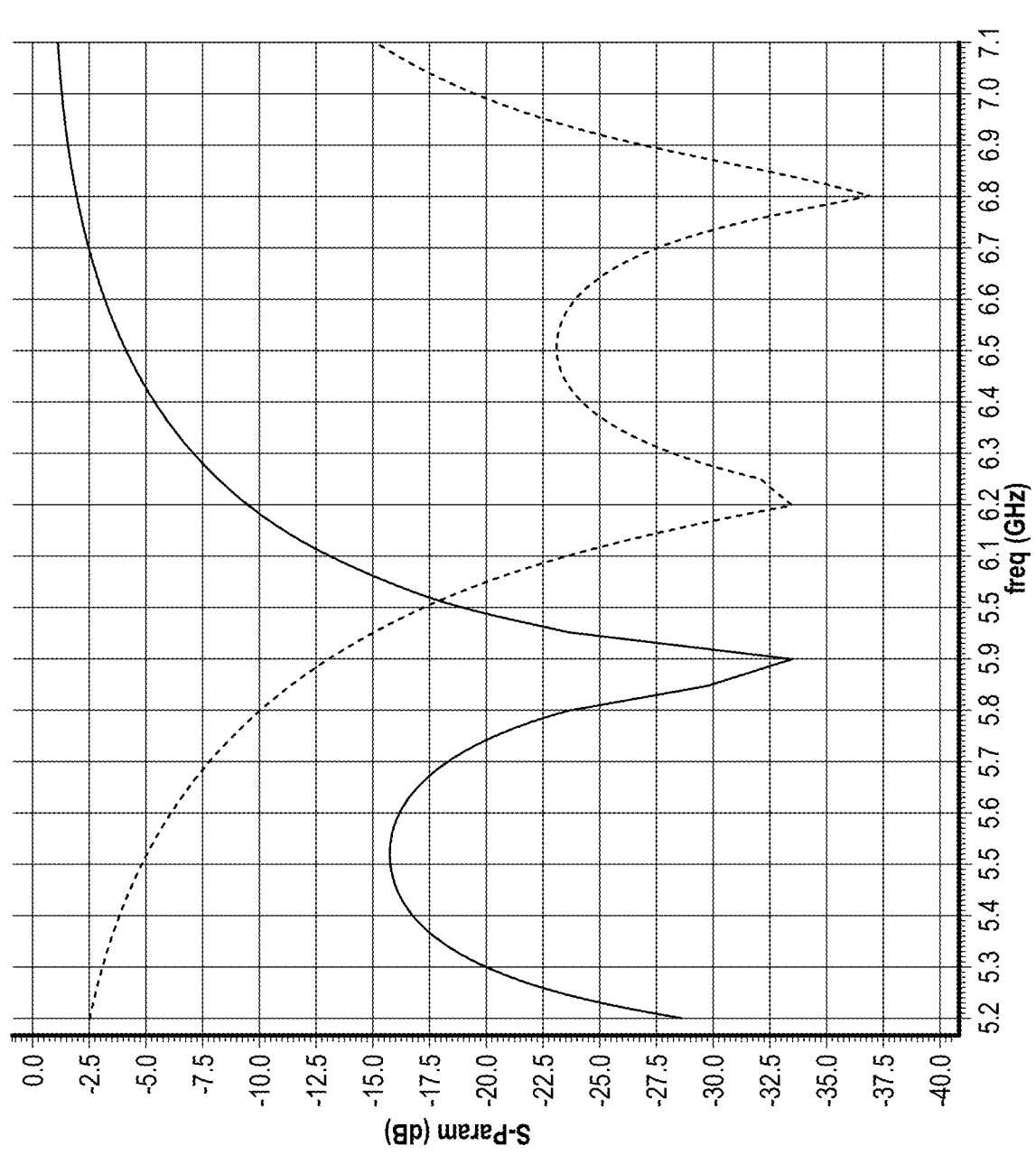
FIG. 29 illustrates output return loss (S22) for a tunable filter where a broadband response is achieved by the coupled resonator filter at the output.

Turning now to FIG. 27, the active filter 2700 includes a magnetically only coupled resonator filter 2704 combined with a source-gate feedback LNA 2708, input notch circuit (Lg, Cn), and magnetically only coupled resonator filter 2720 (having coupling factor k45) at the output of the filter 2700. The broadband matching that is achieved when a coupled resonator filter is added to the output of the LNA (as depicted in FIG. 27) is shown in FIG. 29.

Figure 32B:
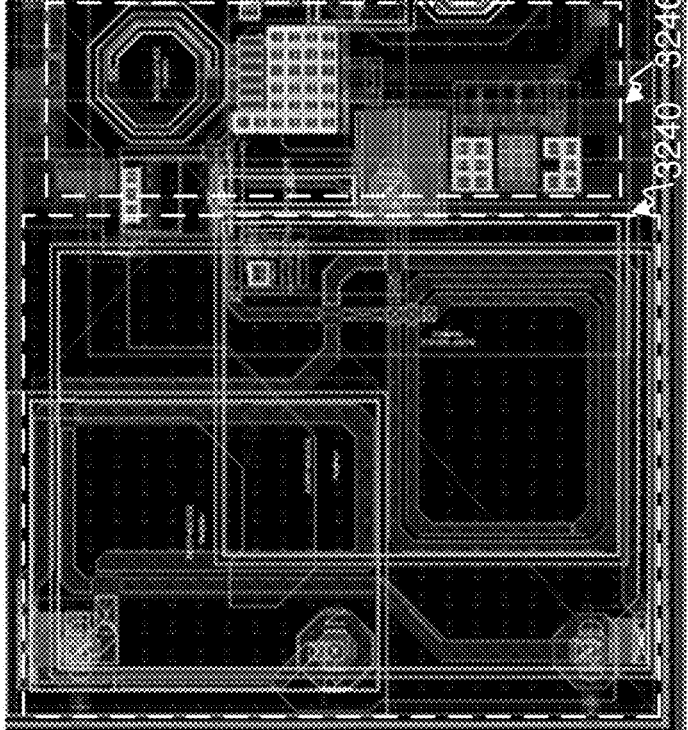
FIG. 32B illustrates an exemplary layout of a magnetically coupled resonator filter and source-degenerated LNA.
Figure 32A:
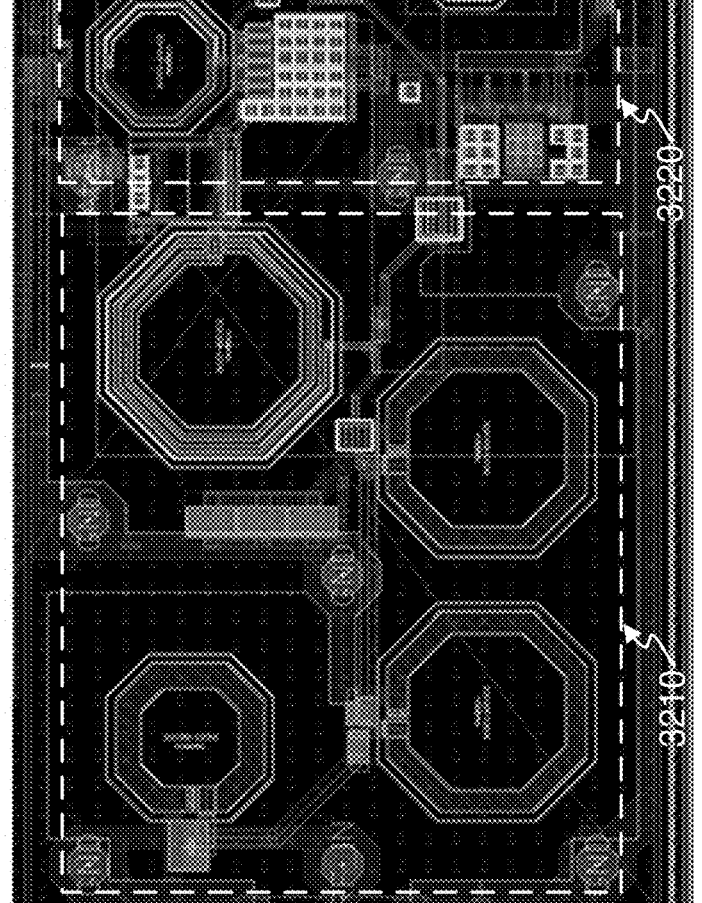
FIG. 32A illustrates an exemplary layout of an electrically coupled resonator filter and source-degenerated LNA.

FIGS. 32A and 32B illustrate the improvements in area efficiency possible using magnetically coupled resonator filters in accordance with the disclosure. Specifically, FIG. 32A depicts an example layout 3200A of an electrically coupled resonator filter and source-degenerated LNA and FIG. 32B shows an example layout 3200B of a magnetic coupled resonator filter and source-degenerated LNA. The example of FIGS. 32A and 32B show that an area reduction of approximately ~30-40% may be obtained using resonators relying essentially exclusively upon magnetic coupling. It may be appreciated that additional area saving is possible with further optimization.

Programmable Coupled Resonator Filter

Figure 30:
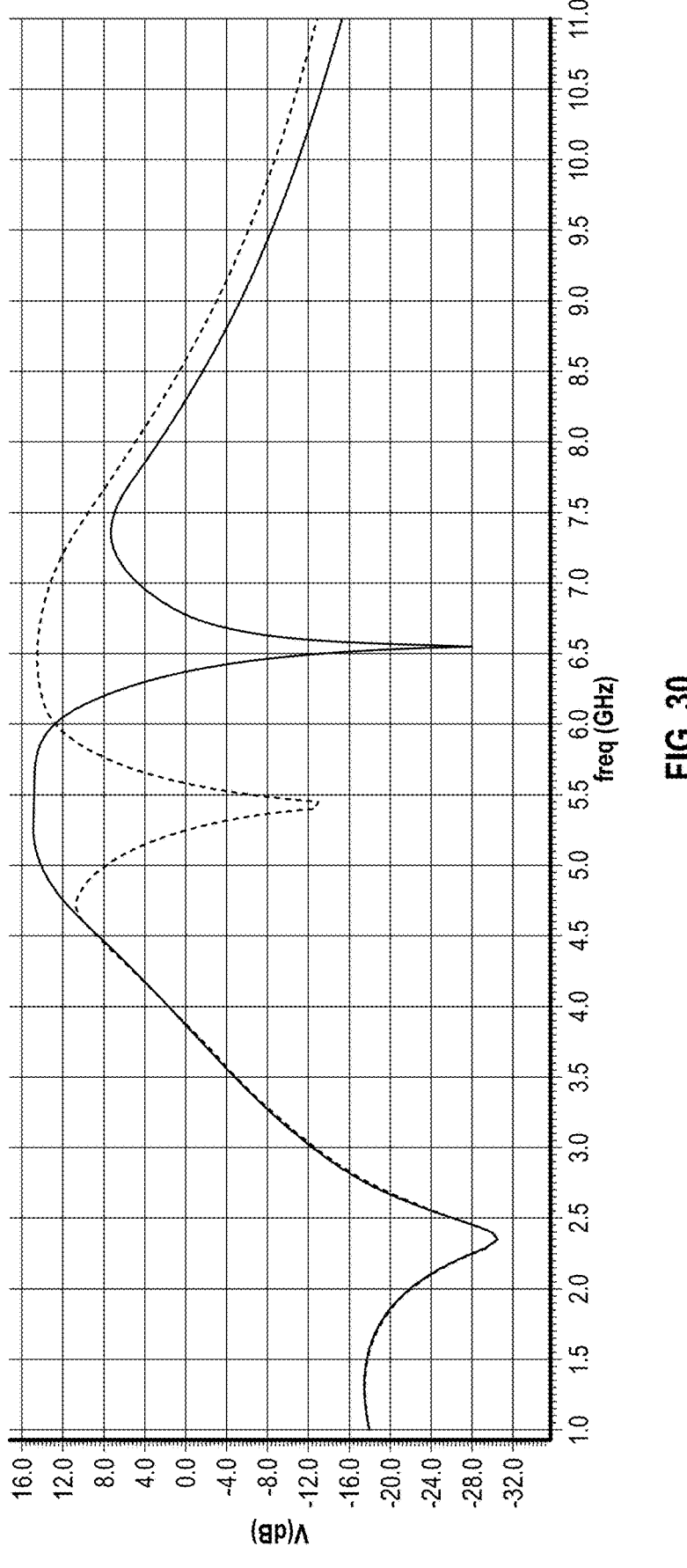
FIG. 30 illustrates a notched frequency response of the receiver of FIG. 5B as implemented with a magnetically-only coupled resonator filter where the filter center frequency is programmable for two different frequency bands.

By having a magnetically only coupled resonator filter it is straight forward to implement band programming of the filter, which is useful in a receiver where the filter response can be tuned to the band of interest. The frequency response of the receiver of FIG. 5 as implemented with a magnetically-only coupled resonator filter which is programmable to receive two different frequency bands (Wi-Fi 6 between 5-6 GHz and Wi-Fi 6E between 6-7 GHz) is shown in FIG. 30.

To make a filter programmable, the capacitors in the filter should be tuned as different capacitance values can be achieved by switching in/out additional capacitances in the filter. This is preferable to switching in/out inductances, which are bulky and occupy large die area. Switches in silicon technologies are generally selected to be either PMOS or NMOS based on which is easiest to program if the source of the switch is connected to signal ground. Accordingly, it is preferable that capacitances to be programmed are grounded in one of the switch's terminals.

Figure 34:
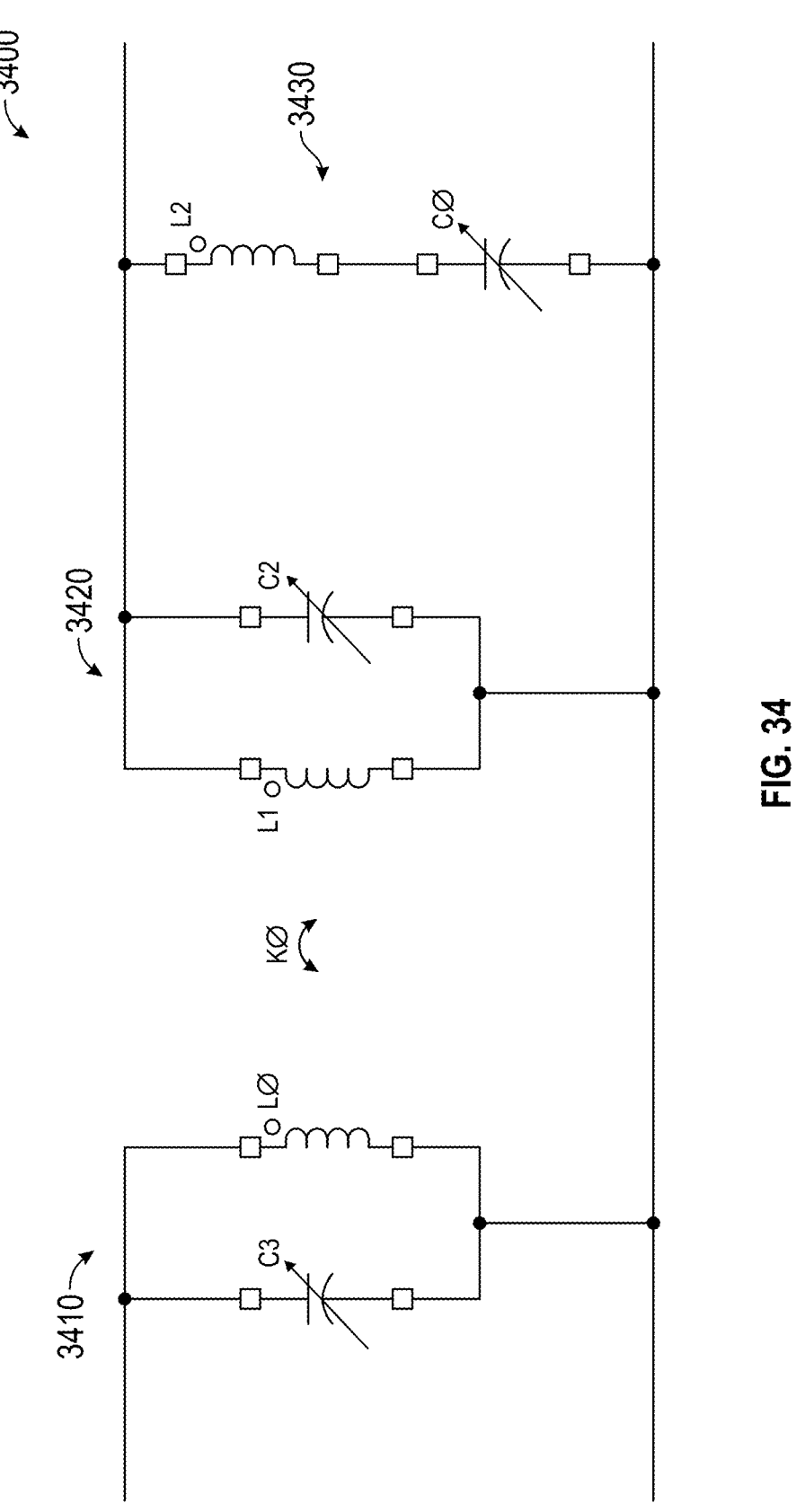
FIG. 34 is a schematic view of tunable coupled resonator filter.
Figure 35:
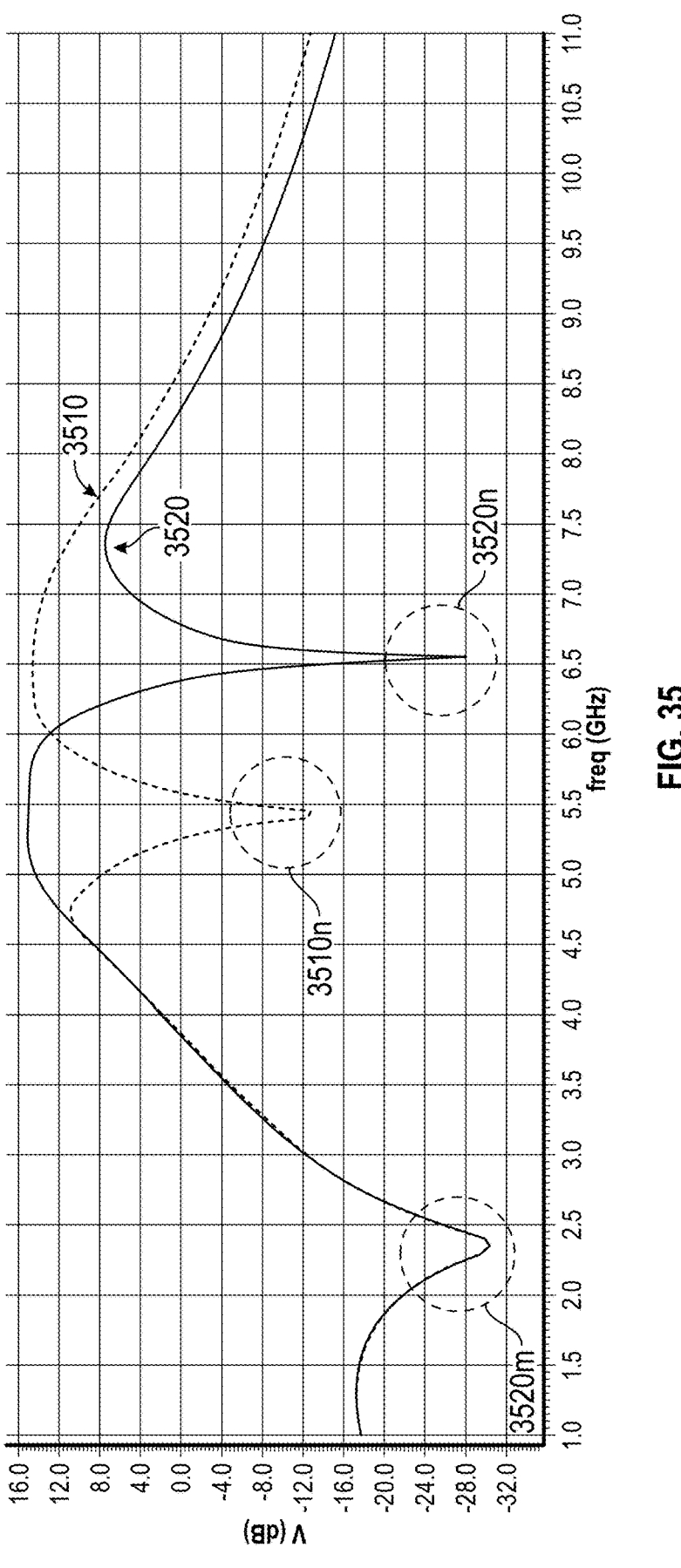
FIG. 35 illustrates frequency responses of the tunable coupled resonator filter of FIG. 34 when configured in two different filter modes.
Figure 36:
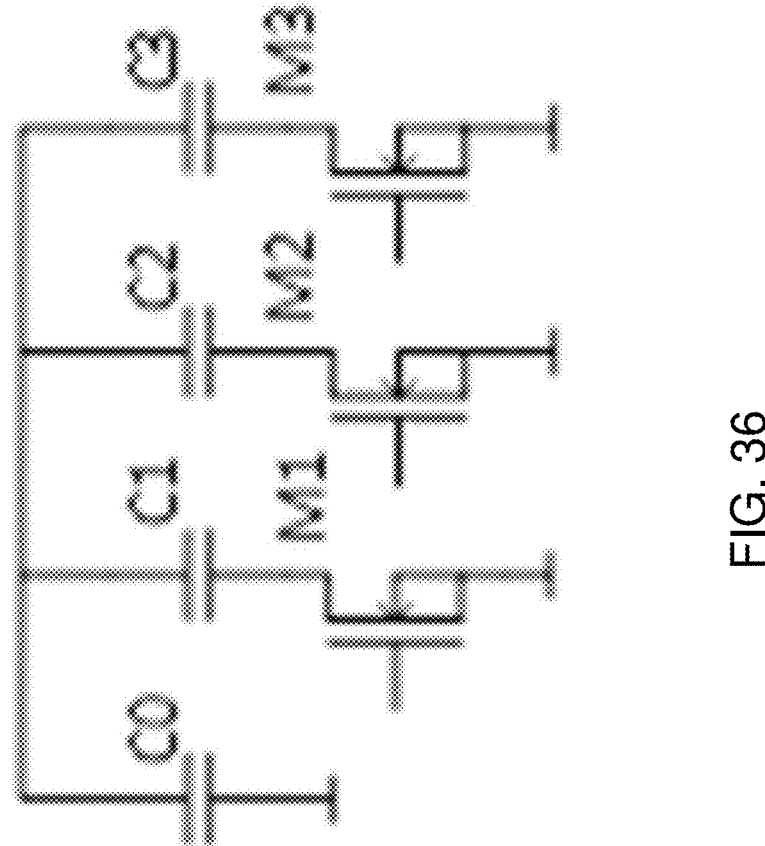
FIG. 36 illustrates an exemplary capacitor filter bank of a type that may be used to implement the programmable capacitances within the filter of FIG. 34.

Turning now to FIG. 34, an exclusively magnetically coupled resonator filter 3400 is shown which includes two coupled resonators 3410, 3420 and a notch circuit 3430 at its output. In the embodiment of FIG. 34 where all capacitances (C) are programmable and connected to ground. FIG. 36 illustrates an exemplary capacitor filter bank 3600 of a type that may be used to implement the programmable capacitances within the filter 3400. The frequency responses 3510, 3520 of the filter 3400, when programmed for either WiFi-6 (5-6 GHz) or in the WiFi-6E (6-7 GHz) frequency band, respectively, are shown in FIG. 35. As may be appreciated from FIG. 35, the frequency response notch 3510$n$, 3520$n$ produced by the notch circuit 3430 is centred in the low band below the passband when the filter is tuned to the high band and vice versa.

During operation of the filter 3400, the notch circuit 3430 helps with the tuning of the output resonator 3420. When the notch circuit 3530 is tuned below the passband the notch circuit 3430 is inductive in the passband and extra parallel capacitance is needed as compensation. This is at the same time as the minimum capacitance is needed in the resonator 3420 to tune it to a high frequency, which therefore reduces the needed tuning range of the capacitor bank 3600 of the output resonator 3420. In other embodiments a second notch circuit can also be attached at the other side of the filter (e.g., in parallel with resonator 3410) so as to improve attenuation.

Mathematical Framework for Filter Parameter Calculation

Although not necessary for one skilled in the art to make and use the disclosed coupled resonator filters, and disclosed combinations of such filters with low noise amplifiers, set forth below is a mathematical framework underpinning an exemplary approach to calculating the parameters. In particular, the following mathematical framework describes the parameter calculations used in the spreadsheet 1000 of FIG. 10, where each calculated cell in the spreadsheet 1000 is described below.

Input parameters:
f0 [MHz] is the center frequency of the filter.
BW [MHz] is the bandwidth of the filter.
Ripple [dB] is the target in-band filter ripple.
RS and RL [$\Omega$] are the target source and load impedances respectively.
Percentage of max coupling factor is the amount of magnetic coupling, 100% means magnetic coupling only and 0% means electric coupling only.
L1, L2 and L3 [H] are the target inductance values of the three resonators.
Calculated Parameters:

$$\omega0 \left[\frac{\text{rad}}{\text{s}}\right] = 2\pi f0$$

$$Q = \frac{f0}{BW}$$

C1res, C2res and C3res [F] (greyed out cells in the spreadsheet 1000) are calculated from the center frequency and the inductance value of each resonator:

$$Cx = \frac{1}{\omega0^2 Lx}$$

These capacitance values are greyed out because these are only used for calculation purposes.
Z1, Z2 and Z3 [$\Omega$] are calculated from the center frequency, the Q-value and the filter prototype values: Zx=$\omega$0 Q gx Lx
Cmp_in is calculated from a relation between the source impedance and the impedance level of the first resonator:

$$Cmp\_in[F] = \frac{\sqrt{\left(\frac{Z1}{RS} - 1\right)}}{Z1\omega0}$$

This capacitance value is greyed out in the spreadsheet 1000 because it is only used for calculation purposes.
Cmp_out is calculated from a relation between the load impedance and the impedance level of the last resonator:

$$Cmp\_out[F] = \frac{\sqrt{\left(\frac{Z3}{RL} - 1\right)}}{Z3\omega0}$$

This capacitance value is greyed out in the spreadsheet 1000 because it is only used for calculation purposes.

Cms_in and Cms_out are the matching capacitances required to impedance match between the source impedance and the impedance level of the first resonator, and between the load impedance and the impedance level of the last resonator respectively.

C1, C2 and C3 [F] are calculated from the other capacitance values: C1 [F]=C1res–C12–Cmsp_in, C1 [F]=C2res–C12–C23, and C3 [F]=C3res–C23–Cmsp_out C12max and C23max [F] are the coupling capacitors between the resonators for the case when only electric coupling is used, and are calculated from the equations:

$$C12 \max [F] = \frac{1}{\omega0\sqrt{Z1Z2}}$$

$$C23 \max [F] = \frac{1}{\omega0\sqrt{Z2Z3}}$$

For the case when only magnetic coupling is used, k12max and k23max are the coupling coefficients between the inductances of the first and second, and the second and third resonators respectively, and are calculated from the equations:

$$k12 \max = \frac{1}{Q\sqrt{g1g2}}$$

$$k23 \max = \frac{1}{Q\sqrt{g2g3}}$$

where the spreadsheet 1000 may be configured to calculate the Chebychev low pass filter prototype values (g1, g2 and g3) with well known equations as used in various filter tables.

The effective coupling coefficients and capacitances between the resonators are calculated from a linear ratio of the percentage of the max coupling factor:

$$C12[F] = \left(1 - \frac{k12}{k12 \max}\right)C12 \max$$

$$C23[F] = \left(1 - \frac{k23}{k23 \max}\right)C23 \max$$

$$k12 = \text{Percantage } k12 \max$$

$$k23 = \text{Percantage } k23 \max$$

The equations k12max, k23max, C12 [F], C23 [F], k12, and k23 have been derived by the present inventors. The equations used in the spreadsheet 1000 of FIG. 10 are taken from the book "*Microwave Filters for Communication Systems*" by Richard J. Cameron et al. Unless otherwise mentioned, the other equations set forth above may be found in the publication entitled "The Design of Direct Coupled Band Pass Filters", published by Iowa Hills Software (IowaHills-.com) on Jul. 10, 2016.

Described herein are integrated magnetically and electrically coupled resonator filters which improve upon existing filters in a number of respects. A principal novel feature of the integrated magnetically and electrically coupled resonator filters described herein is that the layout becomes area efficient when the coupling between inductors can be used as being part of the intended design instead of being something unwanted. In addition, inductors can be laid out in an overlapping fashion to generate exclusively magnetic coupling. The inductors can also be laid adjacent to each other, and insufficient magnetic coupling can be complemented with electrical coupling to establish the intended filter transfer function.

Another important novel feature is that coupling between the first and last resonator generates a notch which can be used to suppress unwanted signals in a specific frequency. In addition, the first inductor can be used as ESD protection when the impedance level of the first resonator is chosen to be the same as the source impedance.

It may be further appreciated that the disclosed filters can be used for impedance transformation to the LNA for optimal noise performance. Moreover, filter tuning becomes straight forward when exclusively magnetic coupling is used.

Also described herein are novel configurations of on-chip coupled resonator filters combined with LNAs. It may be appreciated that the teachings of the present disclosure extend to embodiments in which the LNA is replaced with other types of amplifiers such as, for example, a power amplifier. In the context of these configurations the present inventors have unexpectedly found that the gate capacitance of the LNA can be an integral part of the filter. Moreover, the inventors have found that using a shunt gate inductance at the input of the LNA improves low frequency attenuation. In addition, it has been found that a notch can be generated for increased attenuation at a specific frequency by adding a series capacitance to the gate inductance of the LNA. Moreover, a notch can be generated for increased attenuation at a specific frequency by adding an additional series resonant circuit in parallel with any of the resonators in the filter.

In certain embodiments an on-chip resonator filter can be added to the LNA at both its input and output for broadband matching. The coupled resonator filter can be used to convert a single-ended signal into a differential signal without adding additional passive components. The coupled resonator filter can also be used to convert a differential signal into a single-ended signal without adding additional passive components.

The disclosure also pertains to a novel programmable magnetically-only coupled resonator filter in combination with a notch circuit. The disclosed magnetically-only coupled filter utilizes programmable capacitances which are grounded on one terminal, which simplifies programmability. In addition, the notch circuit reduces the tuning range of the programmable capacitances.

Where methods described above indicate certain events occurring in certain order, the ordering of certain events may be modified. Additionally, certain of the events may be performed concurrently in a parallel process when possible, as well as performed sequentially as described above. Accordingly, the specification is intended to embrace all such modifications and variations of the disclosed embodiments that fall within the spirit and scope of the appended claims.

The foregoing description, for purposes of explanation, used specific nomenclature to provide a thorough understanding of the claimed systems and methods. However, it will be apparent to one skilled in the art that specific details are not required in order to practice the systems and methods described herein. Thus, the foregoing descriptions of specific embodiments of the described systems and methods are presented for purposes of illustration and description. They are not intended to be exhaustive or to limit the claims to the precise forms disclosed; obviously, many modifications and variations are possible in view of the above teachings. The embodiments were chosen and described in order to best explain the principles of the described systems and methods and their practical applications, they thereby enable others skilled in the art to best utilize the described systems and methods and various embodiments with various modifications as are suited to the particular use contemplated. It is intended that the following claims and their equivalents define the scope of the systems and methods described herein.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A coupled resonator filter comprising:
   a first parallel resonator including a first capacitance connected in parallel with a first inductance;
   a second parallel resonator including a second capacitance connected in parallel with a second inductance; and
   a third parallel resonator including a third capacitance connected in parallel with a third inductance;
   a series resonant circuit connected in parallel with any of the first parallel resonator, the second parallel resonator and third parallel resonator wherein a frequency response of the coupled resonator filter includes an additional notch at a frequency dependent upon a resonance frequency of the series resonant circuit;
   wherein magnetic coupling between the first inductance and the second inductance magnetically couples the first parallel resonator and the second parallel resonator in accordance with a first coupling factor;
   wherein magnetic coupling between the second inductance and the third inductance magnetically couples the second parallel resonator and the third parallel resonator in accordance with a second coupling factor;
   wherein magnetic coupling between the first inductance and the third inductance magnetically couples the first parallel resonator and the third parallel resonator in accordance with a third coupling factor;
   wherein a frequency response of the coupled resonator filter includes a notch when values of the first coupling factor, the second coupling factor and the third coupling factor satisfy predetermined conditions.

2. The coupled resonator filter of claim 1 wherein the predetermined conditions include a condition specifying that the notch is included in the frequency response of the coupled resonator filter at a frequency dependent upon the value of the third coupling factor and a product of the first coupling factor and the second coupling factor.

3. The coupled resonator filter of claim 1 further including a first coupling capacitance connected between the first parallel resonator and the third parallel resonator, the first coupling capacitance capacitively coupling the first parallel resonator and the third parallel resonator.

4. The coupled resonator filter of claim 3 further including a second coupling capacitance connected between the first parallel resonator and the second parallel resonator, the second coupling capacitance capacitively coupling the first parallel resonator and the second parallel resonator.

5. The coupled resonator filter of claim 4 further including a third coupling capacitance connected between the second parallel resonator and the third parallel resonator, the third coupling capacitance capacitively coupling the second parallel resonator and the third parallel resonator.

6. The coupled resonator filter of claim 1 wherein the predetermined conditions include a condition that the first coupling factor, the second coupling factor and the third coupling factor are negative.

7. The coupled resonator filter of claim 1 wherein the predetermined conditions include a condition that the first coupling factor and the second coupling factor are positive and the third coupling factor is negative.

8. The coupled resonator filter of claim 1 wherein the predetermined conditions include a condition that the first coupling factor and the second coupling factor are of opposite polarity and the third coupling factor is positive.

9. The coupled resonator filter of claim 1 wherein predetermined conditions include a condition that an absolute value of the first coupling factor and the second coupling factor is greater than 0.25 and an absolute value of the third coupling factor is less than 0.25.

10. The coupled resonator filter of claim 1 wherein the first coupling factor is characterized by a first coupling coefficient k2 and where the second coupling factor is characterized by a second coupling coefficient k23, where:

$$k12 = \frac{1}{Q\sqrt{g1g2}}$$

$$k23 = \frac{1}{Q\sqrt{g2g3}}$$

and where:

$$Q = \frac{f0}{BW}$$

where f0 is a center frequency of the filter, BW is a bandwidth of the filter, and g1, g2, g3 are filter prototype values.

11. A coupled resonator filter comprising:

a first parallel resonator including a first capacitance connected in parallel with a first inductance;

a second parallel resonator including a second capacitance connected in parallel with a second inductance; and a third parallel resonator including a third capacitance connected in parallel with a third inductance;

a first coupling capacitance connected between the first parallel resonator and the third parallel resonator, the first coupling capacitance capacitively coupling the first parallel resonator and the third parallel resonator;

a second coupling capacitance connected between the first parallel resonator and the second parallel resonator, the second coupling capacitance capacitively coupling the first parallel resonator and the second parallel resonator;

wherein magnetic coupling between the first inductance and the second inductance magnetically couples the first parallel resonator and the second parallel resonator in accordance with a first coupling factor;

wherein magnetic coupling between the second inductance and the third inductance magnetically couples the second parallel resonator and the third parallel resonator in accordance with a second coupling factor;

wherein magnetic coupling between the first inductance and the third inductance magnetically couples the first parallel resonator and the third parallel resonator in accordance with a third coupling factor;

wherein a frequency response of the coupled resonator filter includes a notch when values of the first coupling factor, the second coupling factor and the third coupling factor satisfy predetermined conditions;

where a maximum absolute value of the magnetic coupling between the first inductance and the second inductance is characterized by a first maximum coupling coefficient k12max, a maximum magnetic coupling between the second inductance and the third inductance is characterized by a second maximum coupling coefficient k23max, where:

$$k12\max = \frac{1}{Q\sqrt{g1g2}}$$

$$k23\max = \frac{1}{Q\sqrt{g2g3}}$$

$$C12[F] = \left(1 - \frac{k12}{k12\max}\right)C12\max$$

$$C23[F] = \left(1 - \frac{k23}{k23\max}\right)C23\max$$

$k12 = $ Percantage $k12$ max existing between first and second inductances $k23 = $ Percantage $k23$ max existing between second and thrid inductances $C12$ denotes the first coupling capacitance $C12$ denotes the second coupling capacitance and where:

$$Q = \frac{f0}{BW}$$

where f0 is a center frequency of the filter, BW is a bandwidth of the filter, g1, g2, g3 are filter prototype values, and C12max and C23max are coupling capacitances respectively connected between the first and second parallel resonators, and between the second and third parallel resonators, in the absence of magnetic coupling.

12. An integrated circuit coupled resonator filter comprising:

a first parallel resonator including a first capacitance connected in parallel with a first inductance; and a second parallel resonator including a second capacitance connected in parallel with a second inductance;

a series resonant circuit connected in parallel with any of the first parallel resonator and the second parallel resonator wherein a frequency response of the coupled resonator filter includes an additional notch at a frequency dependent upon a resonance frequency of the series resonant circuit;

wherein the first inductance and the second inductance are implemented on multiple layers of the integrated circuit and at least partially overlap;

wherein magnetic coupling between the first inductance and the second inductance magnetically couples the first parallel resonator and the second parallel resonator in accordance with a first coupling factor of greater than 0.5.

13. The integrated circuit coupled resonator filter of claim 12 wherein the first coupling factor is greater than 0.6.

14. The integrated circuit coupled resonator filter of claim 12 wherein the first coupling factor is greater than 0.7.

15. The integrated circuit coupled resonator filter of claim 12 further including a third parallel resonator including a third capacitance connected in parallel with a third inductance;

wherein magnetic coupling between the second inductance and the third inductance magnetically couples the second parallel resonator and the third parallel resonator;

wherein magnetic coupling between the first inductance and the third inductance magnetically couples the first parallel resonator and the third parallel resonator.

16. A coupled resonator filter arrangement comprising:

an Nth order coupled resonator filter including N parallel resonators arranged in succession, where N is at least 3;

wherein a frequency response of the coupled resonator filter arrangement includes a first notch at a first frequency dependent upon coupling characteristics between non-successive parallel resonators of the N parallel resonators;

a series resonant circuit connected in parallel with any of the N parallel resonators wherein the frequency response of the coupled resonator filter arrangement includes a second notch at a second frequency dependent upon a resonance frequency of the series resonant circuit.

17. The coupled resonator of claim 16 wherein the non-successive parallel resonators include a first parallel resonator of the N parallel resonators and a third parallel resonator of the N parallel resonators wherein a second parallel resonator of the N parallel resonators is interposed between the first parallel resonator and the third parallel resonator.

18. The coupled resonator filter arrangement of claim 17 wherein:

the first parallel resonator includes a first capacitance connected in parallel with a first inductance;

the second parallel resonator including a second capacitance connected in parallel with a second inductance; and a third parallel resonator including a third capacitance connected in parallel with a third inductance;

wherein magnetic coupling between the first inductance and the second inductance magnetically couples the first parallel resonator and the second parallel resonator in accordance with a first coupling factor;

wherein magnetic coupling between the second inductance and the third inductance magnetically couples the second parallel resonator and the third parallel resonator in accordance with a second coupling factor;

wherein magnetic coupling between the first inductance and the third inductance magnetically couples the first parallel resonator and the third parallel resonator in accordance with a third coupling factor.

19. The coupled resonator filter arrangement of claim 18 wherein the first coupling factor, the second coupling factor and the third coupling factor are negative.

20. The coupled resonator filter of claim 18 wherein the first coupling factor and the second coupling factor are positive and the third coupling factor is negative.

21. The coupled resonator filter of claim 18 wherein the first coupling factor and the second coupling factor are of opposite polarity and the third coupling factor is positive.

22. The coupled resonator filter of claim 18 wherein an absolute value of the first coupling factor and the second coupling factor is greater than 0.25 and an absolute value of the third coupling factor is less than 0.25.

23. A coupled resonator filter comprising:

a first parallel resonator including a first capacitance connected in parallel with a first inductance;

a second parallel resonator including a second capacitance connected in parallel with a second inductance; and a third parallel resonator including a third capacitance connected in parallel with a third inductance;

a series resonant circuit connected in parallel with any of the first parallel resonator and the second parallel resonator wherein a frequency response of the coupled resonator filter includes an additional notch at a frequency dependent upon a resonance frequency of the series resonant circuit;

wherein magnetic coupling between the first inductance and the second inductance magnetically couples the first parallel resonator and the second parallel resonator in accordance with a first coupling factor;

wherein magnetic coupling between the second inductance and the third inductance magnetically couples the second parallel resonator and the third parallel resonator in accordance with a second coupling factor;

wherein magnetic coupling between the first inductance and the third inductance magnetically couples the first parallel resonator and the third parallel resonator in accordance with a third coupling factor and wherein a frequency response of the coupled resonator filter includes a notch under at least one of the following conditions: (i) the first coupling factor, the second coupling factor and the third coupling factor are negative, (ii) the first coupling factor and the second coupling factor are positive and the third coupling factor is negative, and (iii) the first coupling factor and the second coupling factor are of opposite polarity and the third coupling factor is positive.

24. The coupled resonator filter of claim 23 wherein an absolute value of the first coupling factor and the second coupling factor is greater than a strong coupling threshold and an absolute value of the third coupling factor is less than a weak coupling threshold.

25. The coupled resonator filter of claim 24 wherein the strong coupling threshold is 0.25 and the weak coupling threshold is 0.1.

* * * * *